US005497015A

United States Patent [19]
Ishibashi et al.

[11] Patent Number: 5,497,015
[45] Date of Patent: Mar. 5, 1996

[54] QUANTUM INTERFERENCE TRANSISTOR

[75] Inventors: Akira Ishibashi; Kenji Funato, both of Kanagawa; Yoshifumi Mori, Chiba, all of Japan

[73] Assignee: Sony Corporation, Tokyo, Japan

[21] Appl. No.: 435,987

[22] Filed: Nov. 13, 1989

[30] Foreign Application Priority Data

| Nov. 12, 1988 | [JP] | Japan | 1-286568 |
| Dec. 20, 1988 | [JP] | Japan | 1-321749 |
| Apr. 21, 1989 | [JP] | Japan | 2-102790 |

[51] Int. Cl.$^6$ .................................................. H02L 29/80
[52] U.S. Cl. .................. 257/287; 257/24; 257/194; 257/266
[58] Field of Search .................. 357/22 A, 22 I, 357/22 K, 22 L, 16, 4; 257/20, 24, 27, 194, 266, 287

[56] References Cited

U.S. PATENT DOCUMENTS

| 4,550,330 | 10/1985 | Fowler | 357/16 |
| 4,733,282 | 3/1988 | Chang et al. | 357/16 |
| 4,780,748 | 10/1988 | Cunningham et al. | 357/22 K |
| 4,882,609 | 11/1989 | Schubert et al. | 357/22 A |
| 4,942,438 | 7/1990 | Miyamoto | 357/16 |
| 4,977,435 | 12/1990 | Yoshimura et al. | 357/16 |

FOREIGN PATENT DOCUMENTS

| 62-32659 | 2/1987 | Japan | 357/16 |

Primary Examiner—Sara W. Crane
Assistant Examiner—Courtney A. Bowers

[57] ABSTRACT

A semiconductor device using interference effects of electron waves passing through a multichannel, wherein the multichannel is formed by a Dirac-delta-doped layer. A method of manufacturing a semiconductor device comprising the steps of: selectively forming a region of a predetermined crystallographic orientation onto a semiconductor substrate; and alternately growing the first semiconductor layer and the second semiconductor layer whose electron affinity is smaller than that of the first semiconductor layer onto the region of the predetermined crystallographic orientation by a vapor-phase growth method so as to have a convex shape in a manner such that an area of an upper layer is smaller. A semiconductor device in which a channel portion comprising a zigzag fine line is provided between a source and a drain.

3 Claims, 17 Drawing Sheets

QUANTUM INTERFERENCE TRANSISTOR

BACKGROUND OF THE INVENTION

1. Field of the Invention

The present invention relates to a semiconductor device and its manufacturing method which can be applied to a quantum interference device or a one-dimensional channel field effect transistor (FET).

2. Description of the Prior Art

In recent years, researches and developments of quantum interference devices using interference effects of electron waves have actively been performed. As one kind of quantum interference device, a quantum interference transistor using Aharonov-Bohm effect (hereinafter, referred to as an AB effect transistor) has been known. In the AB effect transistor, the transistor action is executed by using the interference effect of electron waves passing through a multichannel.

FIGS. 1 and 2 show examples of conventional AB effect transistors using a planar multichannel. In the AB effect transistor shown in FIG. 1, a multichannel 101 is formed by a bulk doped semiconductor or a modulation-doped semiconductor. Although one multichannel 101 is formed at positions near the source and drain, it bifurcates into two channels which form a ring shape as a whole at a location between the source and the drain. In this case, an electron wave which enters from one end on the source side (for instance, from the left edge in the diagram) into the multichannel 101 is separated into an electron wave passing through the path A and an electron wave passing through the path B in the ring-shaped portion. Thereafter, they are again joined into one electron wave. Upon joining, an interference between the electron waves occurs. By applying a magnetic field so as to penetrate the ring shaped portion of the multichannel 101 and controlling the phase difference between the electron waves passing through the paths A and B by the magnetic field, the transistor action is executed. On the other hand, in the AB effect transistor shown in FIG. 2, the operation principle is fundamentally the same as that of the AB effect transistor shown in FIG. 1 although it differs therefrom with respect to points that the multichannel 101 has a rectangular shape as a whole at a position between the source and the drain and that the phase difference between the electron waves passing through the paths A and B is controlled by a voltage which is applied between a pair of gate electrodes $G_1'$ and $G_2'$ arranged adjacently at the outside positions of the multichannel 101.

On the other hand, FIG. 3 shows another conventional AB effect transistor using a vertical type (depth direction type) multichannel (Technical Digest of IEDM 1986, P.76, 1986). As shown in FIG. 3, in such an AB effect transistor, the multichannel 101 is formed by double quantum wells comprising modulation-doped semiconductors. Reference numeral 102 denotes a barrier layer. The multichannel 101 bifurcates into two channels on and under the barrier layer 102 at positions between the source and the drain. Even in the case of the AB effect transistor shown in FIG. 3, similarly to the case of the AB effect transistors shown in FIGS. 1 and 2, the phase difference between the electron wave passing through the path A and the electron wave passing through the path B is controlled by a gate voltage which is applied to the gate electrode (not shown) formed on the path A, thereby allowing the transistor action to be executed.

In the conventional AB effect transistors shown in FIGS. 1 and 2, the larger the aspect ratio (=diameter/width) of the multichannel 101 is, the higher the interference effect of the electron waves passing through the paths A and B is and better transistor characteristics can be obtained. Therefore, it is desirable to make the channel finer. However, the impurity concentration in the bulk doped semiconductor is not so high. In the case of using the modulation doping, the concentration of two-dimensional electron gas (hereinafter, referred to as 2DEG) which is formed at the heterojunction interface is not so high, either. Therefore, the width of the depletion layer which is formed on the side surface of the multichannel 101 is fairly large. Thus, although the effective channel width of the multichannel 101 must be extremely narrow, it is actually difficult to make the channel finer.

On the other hand, in the conventional AB effect transistor shown in FIG. 3, a high interference effect of the electron waves is not yet realized. In addition, just like in the case of the AB effect transistors shown in FIGS. 1 and 2, it is difficult to make the channel finer because of the depletion layers which are formed on both side surfaces of the multichannel 101. As a result, the aspect ratio of the channel becomes small.

Further, the AB effect transistors shown in FIGS. 1, 2 and 3 can be operated only at a very low temperature and it is difficult to operate them at a higher temperature.

On the other hand, in recent years, attention has been paid to semiconductor devices having one-dimensional channels. The semiconductor device having the one-dimensional channel has a problem of what is called Anderson localization which predicts that an electron wave function localizes if a localization potential, $V_0$, is larger than a certain limit value. However, the semiconductor device can be operated under the condition of $V_0 < kT$ (where k is Boltzmann's constant and T is the absolute temperature).

In the one-dimensional channel, since the phase space of the final state is limited, electron scattering probability is extremely small and a remarkable increase in electron mobility $\mu$ is expected. Therefore, trials to form a one-dimensional channel have conventionally been performed. As one of the trials, there is a method of forming a one-dimensional channel by a lithography using an electron beam or the like. According to the method, although a one-dimensional channel having a width of about 500 Å can be formed, it is difficult in the present situation to form a one-dimensional channel having a width less than 200 Å. On the other hand, if it is tried to form a number of one-dimensional channels so as to be adjacent to one another by the above method, there are drawbacks such that the width is widened and the interval cannot be narrowed because of what is called a proximity effect. Further, according to the above method, there is also a drawback such that a damage is easily caused when a one-dimensional channel is formed by reactive ion etching (RIE) or the like.

FIG. 4 shows a conventional one-dimensional channel structure. As shown in FIG. 4, in the example an $Al_xGa_{1-x}As$ layer 202, an aluminum arsenide (AlAs) layer 203, a gallium arsenide (GaAs) layer 204, and an AlAs layer 203 are sequentially formed on a semiinsulating GaAs substrate 201. A V-groove 205 is formed in the $Al_xGa_{1-x}As$ layer 202, the AlAs layer 203, and the GaAs layer 204. A gate electrode 206 is formed on the V-groove 205. In the example, one-dimensional electrons are formed in the GaAs layer 204 at the interface with the gate electrode 206 and serve as a one-dimensional channel.

On the other hand, in a conventional one-dimensional channel structure shown in FIG. 5, the GaAs layer 204 and $Al_xGa_{1-x}As$ layer 202 are alternately grown on the semiinsulating GaAs substrate 201, the GaAs layer 204 and $Al_xGa_{1-x}As$ layer 202 are patterned by etching, and thereafter, an $Al_xGa_{1-x}As$ layer 207 is grown on the side surfaces of the layers 204 and 202 and the gate electrode 206 is formed beside the $Al_{1-x}As$ layer 207. In the example, a one-dimensional channel is formed by the one-dimensional electrons which are formed in the GaAs layer 204 at the hetero-interface between the $Al_xGa_{1-x}As$ layer 207 and the GaAs layer 204.

Further, a one-dimensional channel structure as shown in FIG. 6 is also known (Appl. Phys. Lett., 41(7), 635 (1982)). As shown in FIG. 6, in the example, the $Al_xGa_{1-x}As$ (x=0.25) layer 202 and the GaAs layer 204 are alternately grown on the whole surface of the semiinsulating GaAs substrate 201. A mesa structure having a triangular cross-section is formed by processing the GaAs layer 204 and $Al_xGa_{1-x}As$ layer 202 by using a photolithography and a chemical etching. After that, a semiinsulating $Al_xGa_{1-x}As$ (x=0.31) layer 208 is formed on the whole surface by a molecular beam epitaxy (MBE) process. In the example, a one-dimensional channel is formed in a quantum well fine line comprising the GaAs layer 204 which is surrounded by the $Al_xGa_{1-x}As$ layers 202 and 208 as barrier layers.

However, in the conventional one-dimensional channel structures shown in FIGS. 4, 5 and 6 since the surface of the GaAs layer 204 in which the one-dimensional electrons are formed is subjected to the atmosphere during the manufacturing process, there is a drawback such that the characteristics of the surface deteriorate, so that the characteristics of the one-dimensional channel deteriorate, too. Further, in the example shown in FIG. 6, there is also a drawback such that it is not always easy to form the mesa structure having the triangular cross sectional shape.

On the other hand, historically, development of an ultrahigh speed device has passed from a bulk device using a three-dimensional electron running layer such as the Schottky-gated field effect transistor (MESFET), junction-gate FET (JFET), or the like and a device using a two-dimensional electron running layer such as a high electron mobility transistor (HEMT) or the like to a one-dimensional channel device although not completed yet.

Although the above three-dimensional electron device and two-dimentional electron device have already been put into practical use, in those devices, phonons exert a definite influence on the operation of the device, causing the characteristics to be deteriorated. On the other hand, in the present situation, realization of a practical one-dimensional device is fairly difficult at a stage in which fluctuations of the current-voltage (I-V) characteristics or the like are measured. In addition, in the one-dimensional channel device, since a quantum effect appears only at a very low temperature because of the scattering by the phonons, it is considered that such a point will become a problem in future when the one-dimensional channel device is put into practical use.

OBJECTS AND SUMMARY OF THE INVENTION

It is, therefore, an object of the present invention to provide a semiconductor device which can raise the interference effect of the electron waves by increasing the aspect ratio of the channel.

Another object of the present invention is to provide a semiconductor device in which high integration density can be realized.

Still another object of the present invention is to provide a semiconductor device which can be operated at a higher temperature.

Yet another object of the present invention is to provide a method of manufacturing a semiconductor device in which a one-dimensional channel of good characteristics can be obtained.

Another object of the present invention is to provide a semiconductor device which can realize a semiconductor device of the one-dimensional channel with high performance in which influence of the phonons is suppressed.

Further object of the present invention is to provide a method of manufacturing a semiconductor device in which a semiconductor device of the one-dimensional channel with high performance in which influence by phonons is suppressed can be easily manufactured.

In accordance with an aspect of the present invention, there is provided a semiconductor device using interference effects of electron waves passing through a multichannel, wherein the multichannel is formed by a Dirac-delta-doped layer.

The Dirac-delta-doped layer denotes the impurity with the thickness of a monoatomic layer which is placed at a depth position from the surface of a semiconductor layer so as to have a two-dimensional extent. When z axis is set in the depth direction from the surface of the semiconductor layer, a Dirac-delta-doped layer formed at a position of a depth d from the surface can be mathematically expressed by the Dirac-delta-function as follows.

$$N_D(z)=N_{2D}\delta(z-d) \quad (1)$$

Therefore, such a layer is called a Dirac-delta-doped layer as mentioned above. $N_D(z)$ denotes a three-dimensional doping concentration and $N_{2D}$ indicates a two-dimensional doping concentration. The Dirac-delta-doped layer is denoted as δ-doped layer hereinafter.

The concentration of two-dimensional electron gas (2DEG) which is formed at the portion of the δ-doped layer can be set to an extremely high value of about $10^{13}/cm^2$ as sheet concentration (of about $10^{13}/cm^3$ as volume concentration), so that widths of depletion layers which are formed in both side portions of the multichannel composed of the δ doped layers can be reduced to a small value of about tens of Å or less. Thus, since the channel can be made fine because of the thin depletion layer, the aspect ratio of the channel can be increased. Due to this, the interference effect of the electron waves can be raised.

In accordance with another aspect of the present invention, there is provided a semiconductor device using interference effects of electron waves passing through a multichannel, wherein the multichannel is formed by a Dirac-delta-doped layer and satisfying the inequality $$2w<W<3\lambda_e, \quad (2)$$

where W is the width of the multichannel, w width of depletion layer formed on both sides of the multichannel, and $\lambda_e$ the de Broglie wavelength of the electron wave.

The inequality (2) has the following meaning. When W<2w, the depletion layer is formed in the channel over its whole width. Thus, for finite conductance the lower limit of the channel width W is set to 2w. On the other hand, when the channel width W is large, the electron wave passing through the channel is easily subjected to inelastic scatterings or elastic scatterings due to phonons, so that the semiconductor device can be operated only at a very low temperature. To suppress the scattering of the electron wave, it is effective to set the channel width W less than three times the de Broglie wavelength $\lambda_e$ (for instance, about a few hundreds of Å) of the electron wave, that is $3\lambda_e$. Due to this, the upper limit of the channel width W is set to $3\lambda_e$.

Since the multichannel is formed by the δ-doped layers, the interference effect of the electron waves can be raised in a manner similar to the above. On the other hand, since $2w<W<3\lambda_e$, the channel width W is set to an ultrafine width which is comparable with the de Broglie wavelength $\lambda_e$ of the electron wave. Thus, high integration density can be realized. Further, since the scattering probability of the electron wave passing through the channel decreases, the semiconductor device can be operated at a higher temperature.

In accordance with still another aspect of the present invention, there is provided a method of manufacturing a semiconductor device, comprising the steps of:

selectively forming a region of a predetermined crystallographic orientation onto a semiconductor substrate; and alternately growing the first semiconductor layer and the second semiconductor layer whose electron affinity is smaller than that of the first semiconductor layer onto the region of the predetermined crystallographic orientation by a vapor-phase epitaxial method so as to have a convex shape in a manner such that an area of the upper layer is smaller.

A quantum well fine line comprising the first semiconductor layer can be easily formed on the region of the predetermined crystallographic orientation without using an advanced etching technique or the like. Thus, a one-dimensional channel can be easily formed by the quantum well fine line.

In accordance with yet another aspect of the present invention, there is provided a method of manufacturing a semiconductor device, comprising the steps of:

selectively forming a region of a predetermined crystallographic orientation onto a semiconductor substrate;

alternately growing the first semiconductor layer and the second semiconductor layer whose electron affinity is smaller than that of the first semiconductor layer onto the region of the predetermined crystallographic orientation by a vapor-phase epitaxial method so as to have a convex shape in a manner such that an area of the upper layer is smaller; and forming the third semiconductor layer which contains impurities and whose electron affinity is smaller than that of the first semiconductor layer by a vapor-phase epitaxial method so as to cover the convex portion.

Since electrons are supplied from the third semiconductor layer to the first semiconductor layer, one-dimensional electrons are formed in the first semiconductor layer at the hetero interface between the third semiconductor layer and the first semiconductor layer and a one-dimensional channel is formed by the one-dimensinal electrons. In this case, since the third semiconductor layer can be continuously grown in the same vapor-phase growth apparatus subsequent to the growth of the first and second semiconductor layers, the surface of the first semiconductor layer of the portion where the one-dimensional electrons are to be formed is not subjected to the atmosphere during the manufacturing process. Due to this, a one-dimensional channel having good characateristics can be easily formed with certainty.

In accordance with another aspect of the present invention, there is provided a semiconductor device comprising:

the first semiconductor layer and a second semiconductor whose electron affinity is smaller than that of the first semiconductor layer which are alternately grown so as to have a convex shape in a manner such that an area of the upper layer is smaller;

the third semiconductor layer which is formed so as to cover the convex portion and which contains impurities and whose electron affinity is smaller than that of the first semiconductor layer;

a gate electrode formed on the third semiconductor layer; and a channel which is formed in the first semiconductor layer at a hetero interface between the first and third semiconductor layers.

A one-dimensional channel is formed by the one-dimensional electrons which are formed in the first semiconductor layer at the hetero-interface between the third semiconductor layer and the first semiconductor layer. On the other hand, the first, second, and third semiconductor layers can be continuously grown in the same vapor-phase growth apparatus. Therefore, the surface of the first semiconductor layer of the portion where one-dimensional electrons are to be formed is not subjected to the atmosphere during the manufacturing process. Thus, an FET having a one-dimensional channel structure of good characteristics can be realized.

In accordance with another aspect of the present invention, there is provided a semiconductor device, wherein a channel portion comprising a zigzag fine line is provided between a source and a drain.

Since the fine line is zigzag, in marked contrast to the conventional case where a channel is constructed straight, wavelengths of phonons which are confined in the fine line are limited. Thus, the scattering cross-section between carriers (electrons or holes) and phonons which pass through the fine line decreases because of the limitation in phase space and it becomes less probable that the carriers are scattered by the phonons. Due to this, a semiconductor device of the one-dimensional channel of high performance in which an influence by phonons is suppressed can be realized.

The above description will now be more quantitatively explained as follows. Now, a consideration will be made with respect to the case where, for instance, the carriers are electrons. In the one-dimensional fine line, degeneracy of electrons occurs and the degenerate electron gas is formed. An average spatial interval of the elastic scattering of the electrons in the degenerate electron gas, that is, the elastic-scattering length L, of the electrons is given by $$L_e \sim v_F \tau_E, \qquad (3)$$

where $v_F$ denotes the electron velocity and $\tau_E$ the relaxation time. In the semiconductor, since $v_F$ is $\sim 10^7$cm/sec and $\tau_E \sim 10^{-14}$ sec, $L_e$ is $\sim 10^{-7}$cm = 10 Å. In the case of metal, since $v_F$ is $10^8$cm/sec and $\tau_E \sim 10^{-15}$, $L_e$ is $\sim 10^{-7}$cm = 10 Å similarly to the case of semiconductor. That is, it will be understood that the direction of the moving electrons in the degenerate electron gas is made at random at an average interval of 100 Å or less. On the other hand, since the phonons have a high directivity, its transferring direction is difficult to change. Therefore, by setting a construction of the zigzag fine line as mentioned above, the phonons are confined in each segment of the zigzag structure, and the scattering of the electrons by the phonons can be suppressed. The above discussion can be also similarly applied to the case where the carriers are holes.

In accordance with another aspect of the present invention, there is provided a manufacturing method of a semiconductor device in which a channel portion comprising a zigzag fine line is provided between a source and a drain, comprising the steps of:

processing a semiconductor substrate into a grating shape; and forming the fine line onto the semiconductor substrate processed into the grating shape.

By forming a fine line onto a semiconductor substrate processed into a grating shape in a manner such that the fine line crosses their convex portions, it is possible to obtain such a structure that the fine line is bent along the surfaces of the grating-shaped semiconductor substrate. Due to this, a semiconductor device of the one-dimensional channel of high performance, in which influence by phonons is suppressed, can be easily manufactured.

The above, and other, objects, features and advantages of the present invention will become readily apparent from the following detailed description thereof which is to be read in connection with the accompanying drawings.

DETAILED DESCRIPTION OF THE PREFERRED EMBODIMENTS

Embodiments of the present invention will be described hereinbelow with reference to the drawings.

Figure 7:
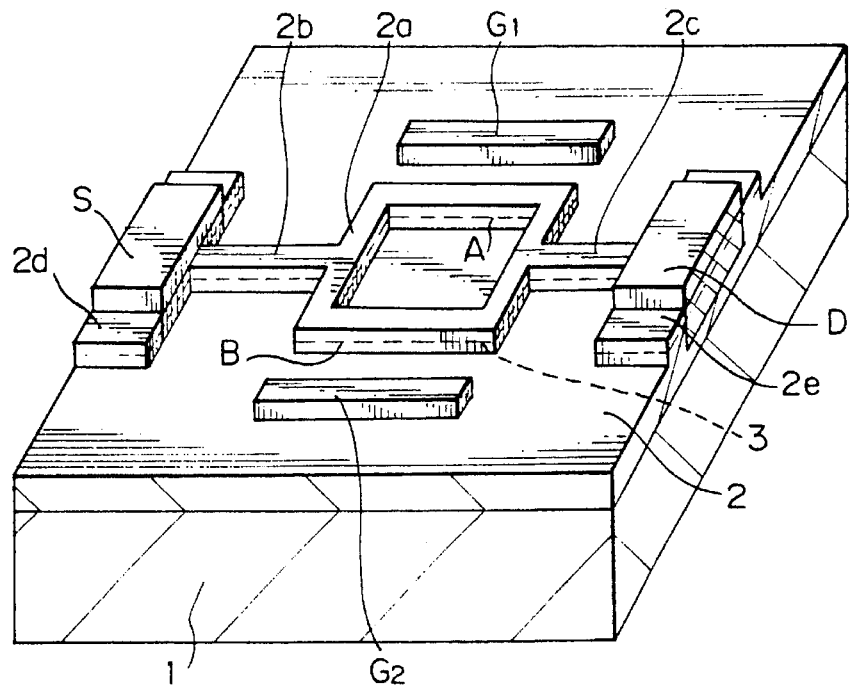
FIG. 7 is a perspective view showing an AB effect transistor according to the first embodiment of the present invention.

FIG. 7 shows an AB effect transistor according to the first embodiment of the present invention. The first embodiment relates to an embodiment in which the invention is applied to an AB effect transistor using a planar multichannel.

As shown in FIG. 7, in the AB effect transistor according to the first embodiment, a semiinsulating GaAs layer 2 is formed on a semiinsulating GaAs substrate 1. A quadrangular (for instance, square) portion 2a is formed on the semiinsulating GaAs layer 2. Rectilinear portions 2b and 2c which vertically extend in the opposite directions from a pair of opposite sides of the quadrangular portion 2a and pad portions 2d and 2e are also formed on the semiinsulating GaAs layer 2. A δ-doped layer 3 is formed in the quadrangular portion 2a, rectilinear portions 2b and 2c, and pad portions 2d and 2e. Donor impurities such as silicon (Si) are used as impurities of the δ-doped layer 3. A concentration of 2DEG which is formed in the δ-doped layer 3 can be set to a high value of, for instance, about $10^{13}/cm^2$.

Gate electrodes $G_1$ and $G_2$ are respectively formed on both sides of the quadrangular portion 2a. The gate electrodes $G_1$ and $G_2$ are made of a metal such as tungsten (W). On the other hand, a source S and a drain D are formed in the pad portions 2d and 2e, respectively. The source S and drain D are formed in a manner such that, for instance, after an ohmic metal film such as AuGe/Ni is formed on the pad portions 2d and 2e, the AuGe/Ni film is being thermally treated and alloyed with the pad portions 2d and 2e. On the other hand, depths of the source S and drain D are selected to values such that the source S and drain D are connected with the δ-doped layer 3. It is also possible to construct in a manner such that the δ-doped layer 3 is formed in the portions which are close to the surfaces of the pad portions 2d and 2e and the electrons can move between the 2DEG in the δ-doped layer 3 and the source S and drain D by means of the tunnel effect.

In the AB effect transistor according to the first embodiment constructed as mentioned above, the multichannel serving as paths of electron waves is formed by the δ-doped layer 3 having the same planar shape as those of the quadrangular portion 2a and rectilinear portions 2b and 2c. In this case, the electron wave which enters from the rectilinear portion 2b on the source side into the multichannel bifurcates into two electron waves passing through the paths A and B by the quadrangular portion 2a. Thereafter, they are again joined in the rectilinear portion 2c and become one electron wave. The phase difference between the two electron waves passing through the paths A and B is controlled by the gate voltage which is applied to the gate electrodes $G_1$ and $G_2$, thereby allowing the transistor action to be executed. Actually, the phase difference between the electron waves can be controlled by fixing one of the gate electrodes $G_1$ and $G_2$, for instance, the gate electrode $G_2$ to a predetermined potential (for instance, earth potential) and by changing the gate voltage which is applied to the other gate electrode $G_1$.

An example of a method of manufacturing the AB effect transistor according to the first embodiment constructed as mentioned above will now be described.

As shown in FIG. 7, the semiinsulating GaAs layer 2 is first epitaxially grown on the semiinsulating GaAs substrate 1 by, for instance, a molecular beam epitaxy (MBE) method. In this case, during the above process, the growing operation is once interruped and donor impurities such as Si are epitaxially grown so as to obtain a monoatomic layer, thereby forming the δ-doped layer 3 on the whole surface. Next, the semiinsulating GaAs layer of a predetermined thickness is again grown on the δ-doped layer 3.

Next, the semiinsulating GaAs layer 2 and the δ-doped layer 3 are patterned by etching until a predetermined depth deeper than the δ-doped layer 3, thereby forming the quadrangular portion 2a, rectilinear portions 2b and 2c, and pad portions 2d and 2e.

Next, an AuGe/Ni film is formed on the whole surface by, for example, a vacuum evaporation method and is patterned into a predetermined shape by etching and, thereafter, it is thermally treated. As a result, the AuGe/Ni film is alloyed with the pad portions 2d and 2e, thereby forming the source S and drain D. Next, after a metal film such as W was formed on the whole surface by, for instance, a sputtering method or a vacuum evaporation method, the metal film is patterned by etching and the gate electrodes $G_1$ and $G_2$ are formed. Due to this, an objective AB effect transistor is completed.

According to the first embodiment, since the multichannel is formed by the δ-doped layer 3, the widths of the depletion layers which are formed in both side portions of the channel are so small (about tens of Å) that the channel can be made fine (order of 100 Å). Thus, since the aspect ratio of the channel can be increased, the interference effect of the electron waves passing through the paths A and B can be raised and good transistor characteristics can be obtained. On the other hand, since the interference effect of the electron waves can be improved, both of the on/off states of the transistor can be more easily discriminated and a noise margin can be increased. Further, as mentioned above, since the aspect ratio of the channel can be high, the dimensions of the quadrangular portions 2b and 2c can be reduced. Thus, in the case of integrating the transistor, high integration density can be realized.

It should be noted that the quadrangular portion 2a in the first embodiment can be also set into another shape, for instance, a ring shape.

Figure 8:
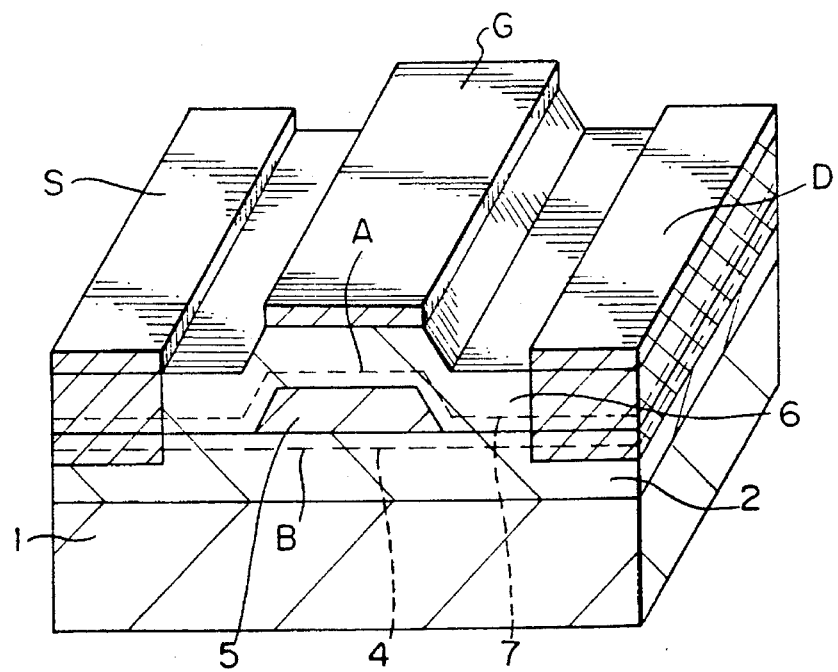
FIG. 8 is a perspective view showing an AB effect transistor according to the second embodiment of the present invention.

FIG. 8 shows an AB effect transistor according to the second embodiment of the present invention. The second embodiment relates to an embodiment in the case where the invention is applied to an AB effect transistor using a vertically aligned multichannel.

As shown in FIG. 8, in the AB effect transistor according to the second embodiment, the semiinsulating GaAs layer 2 is formed on the semiinsulating GaAs substrate 1. The δ-doped layer 4 is formed in the semiinsulating GaAs layer 2. In addition, a belt-shaped semiinsulating $Al_xGa_{1-x}As$ layer (barrier layer) 45 is formed on the semiinsulating GaAs layer 2. The semiinsulating GaAs layer 6 is formed on the semiinsulating GaAs layer 2 and $Al_xGa_{1-x}As$ layer 45. The δ-doped layer 7 is formed in the semiinsulating GaAs layer 6. Here, G denotes the gate electrode.

In the second embodiment, the vertically aligned multichannel is constructed by the δ-doped layers 4 and 7. In this case, the electron wave which enters from one end on the source S side into the multichannel bifurcates into two electron waves passing through the paths A and B on and under the $Al_xGa_{1-x}As$ layer 5 and, thereafrer, they are again joined and become one electron wave. The phase difference between the two electron waves passing through the paths A and B is controlled by the gate voltage which is applied to the gate electrode G, thereby allowing the transistor action to be executed.

An example of a method of manufacturing the AB effect transistor according to the second embodiment construced as mentioned above will now be described.

As shown in FIG. 8, the semiinsulating GaAslayer 2 is first epitaxially grown on the semiinsulating GaAs substrate 1. The δ-doped layer 4 is formed during the growing process. Next, the $Al_xGa_{1-x}As$ layer 5 is epitaxially grown on the whole surface of the semiinsulating GaAs layer 2. Thereafter, the $Al_xGa_{1-x}As$ layer 5 is patterned by etching so as to become a predetermined shape. Next, the semiinsulating GaAs layer 6 is epitaxially grown on the whole surface and the δ-doped layer 7 is formed during the growing process. Next, by using a method similar to the method which has already been mentioned in the first embodiment, the source S and drain D are formed and the gate electrode G is formed, thereby completing an objective AB effect transistor.

According to the second embodiment, since the multichannel is formed by the δ-doped layers 4 and 7, there are the following advantages. The thickness of the channel which is formed by the δ-doped layers 4 and 7 is extremely small to be about 20 to 30 Å. On the other hand, in the conventional AB effect transistor shown in FIG. 3, the width of a quantum well constructing the multichannel 101 is about 200 Å and is by about one order of magnitude larger than the thickness of the channel which is formed by the δ-doped layers 4 and 7. Therefore, in the AB effect transistor according to the second embodiment, the aspect ratio of the channel can be increased by about one order of magnitude compared to that of the conventional AB effect transistor shown in FIG. 3. Due to this, the interference effect of the electron waves passing through the paths A and B can be remarkably raised and the extremely good transistor characteristics can be obtained. On the other hand, the noise margin can be increased in a manner similar to the first embodiment.

Figure 9:
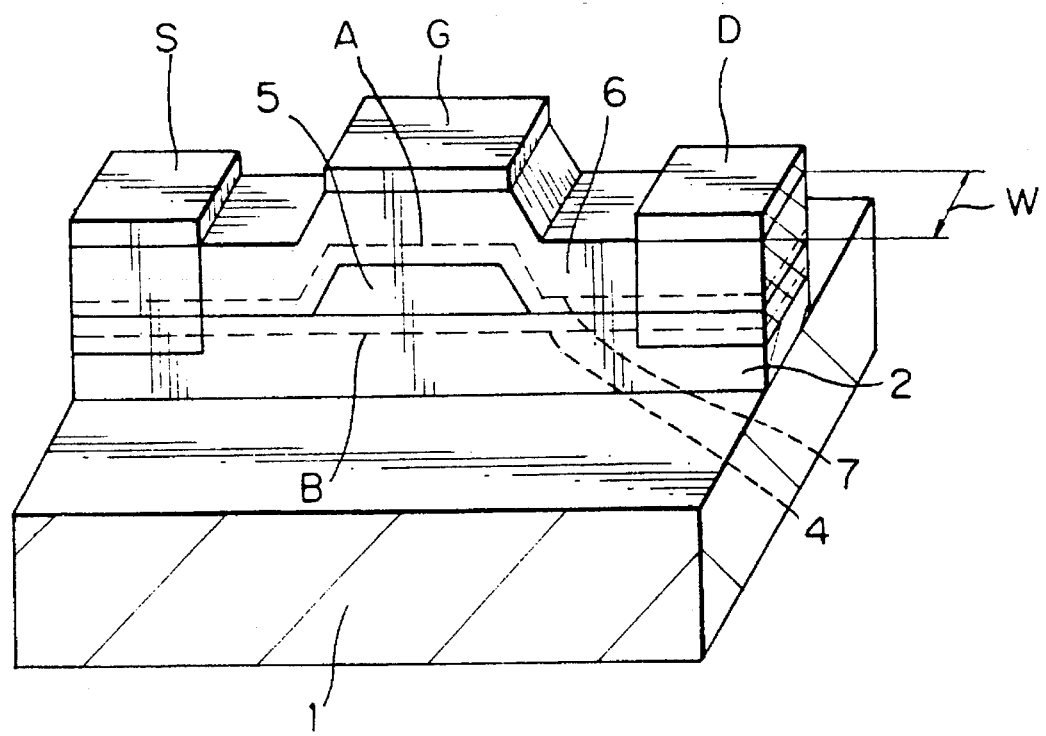
FIG. 9 is a perspective view showing an AB effect transistor according to the third embodiment of the present invention.

FIG. 9 shows an AB effect transistor according to the third embodiment of the present invention.

The AB effect transistor according to the third embodiment has a construction similar to the AB effect transistor according to the second embodiment except that the channel width W is selected to a value which is comparable with the de Broglie wavelength $\lambda_e$ of electron.

According to the third embodiment, there are the following advantages in addition to the advantages similar to those in the second embodiment. Since the channel width W is ultrafine, being almost equal to the de Broglie wavelength $\lambda_e$, the size of transistor can be extremely small. Thus, high integration density can be realized in the case of integrating the AB effect transistor. On the other hand, since the available phase space for electrons in such an ultrafine channel is limited, the scattering probability of the electron wave passing through the channel decreases drastically, so that the transisitor can be operated not only at a very low temperature but also at a higher temperature.

Further, there are also the following advantages. When the semiinsulating GaAs layers 2 and 6 and semiinsulating Al$_x$Ga$_{1-x}$As layer 5 are epitaxially grown, there is a case where they become n-or p-type unintentionally, for example, due to mixture of impurities or the like. Thus, there is a fear such that the interference effect of the electron waves is lost because the thought-to-be semiinsulating GaAs layers 2 and 6 and semiinsulating Al$_x$Ga$_{1-x}$As layer 5 are now transformed into the n-type or p-type and are conductive. However, according to the third embodiment, since the channel width W has an ultrafine width which is almost equal to the de Broglie wavelength $\lambda_e$ as mentioned above, the GaAs layers 2 and 6 and Al$_x$Ga$_{1-x}$As layer 5 can be depleted over the whole width, even if they become n-type or p-type, unintentionally. Therefore, even in the case where the semiinsulating GaAs layers 2 and 6 and semiinsulating Al$_x$Ga$_{1-x}$As layer 5 were transformed into an n-type or p-type as mentioned above, these tranformed semiinsulating GaAs layers 2 and 6 and semiinsulating Al$_x$Ga$_{1-x}$As layer 5 themselves do not function as a channel but only the δ-doped layers 4 and 7 serve as a channel, so that no problem occurs.

It should be noted that the AB effect transistors according to the first, second and third embodiments can be also constructed by a semiconductor other than GaAs and Al$_x$Ga$_{1-x}$As.

Figure 10A:
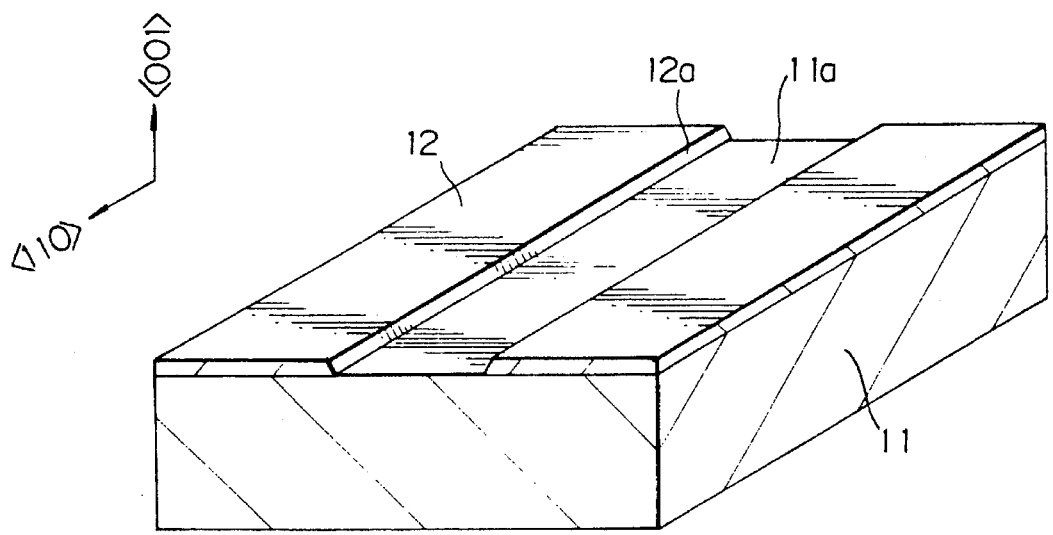
FIGS. 10A to 10C are perspective views for explaining the fourth embodiment of the present invention in accordance with the order of steps.
Figure 10B:
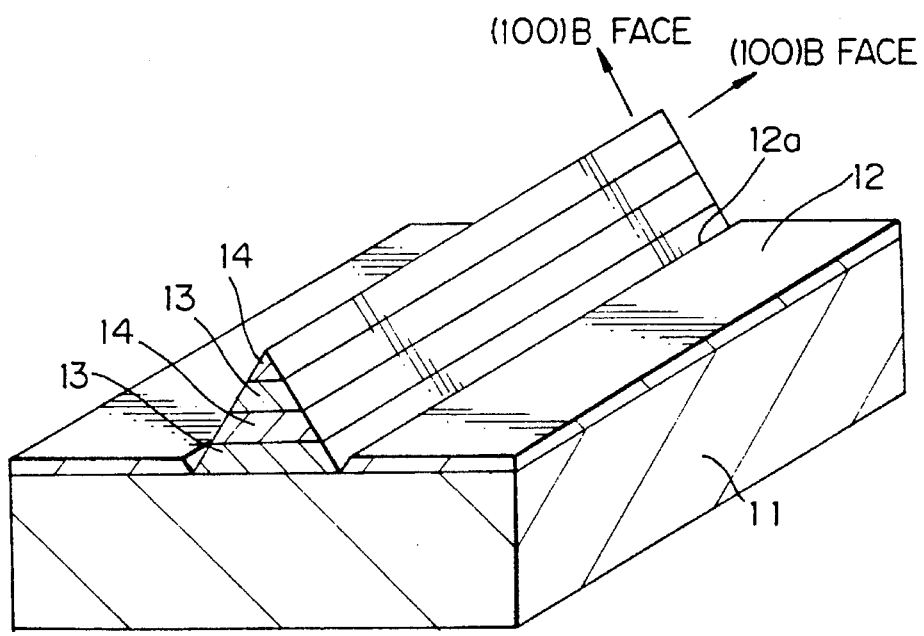
Figure 10C:
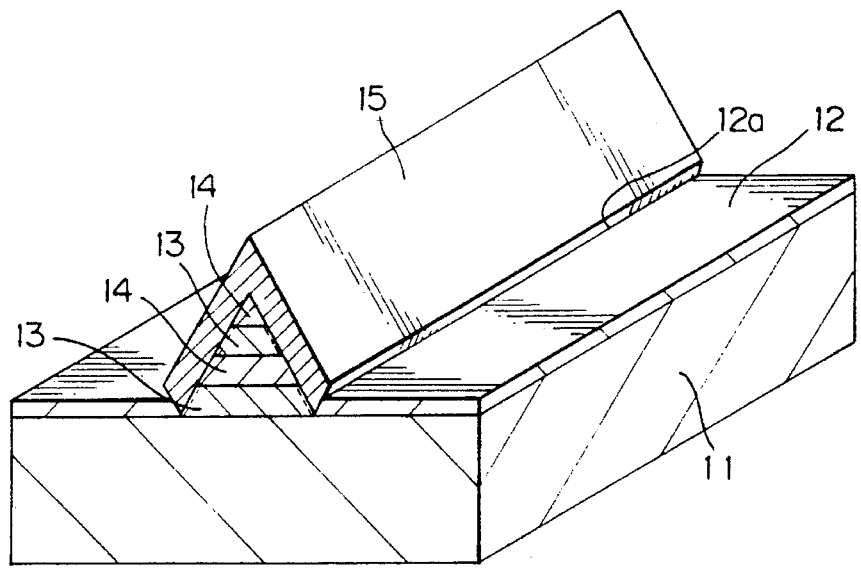

FIGS. 10A to 10C show the fourth embodiment of the present invention. The fourth embodiment relates to an embodiment in the case where the invention is applied to the manufacturing of a semiconductor device having one-dimensional channels through quantum well fine line comprising GaAs.

In the fourth embodiment, as shown in FIG. 10A, an insulating film 12 such as SiO$_2$ film is formed onto, for instance, a semiinsulating GaAs substrate 11 by, for example, chemical vapor deposition (CVD) method or the like. After that a predetermined portion of the insulating film 12 is removed by etching, thereby forming a stripe-shaped opening 12a. In this case, for instance, a substrate of (001) orientation is used as the semiinsulating GaAs substrate 11 and the extending direction of the opening 12a is set to the <1$\bar{1}$0> direction. A region 11a of the (001) face is selectively formed in the opening 12a.

Next, as shown in FIG. 10B, a semiinsulating GaAs layer 13 and a semiinsulating Al$_x$Ga$_{1-x}$As layer 14 are alternately grown by metal organic chemical vapor deposition (MOCVD) method at reduced pressure or at atmospheric pressure. Source materials of the trimethyl compounds are used for the MOCVD. Practically speaking, as sources of Ga and Al, trimethly gallium ((CH$_3$)$_3$Ga, TMG) and trimethly aluminum ((CH$_3$)$_3$Al, TMA) are used, respectively. For As arsine (AsH$_3$) is used. In this case, the GaAs layer 13 and Al$_x$Ga$_{1-x}$As layer 14 are not grown on the insulating film 12 but are selectively grown only on the region 11a in the opening 12a of the insulating film 12. On the other hand, when executing the MOCVD using the source materials of the trimethyl compounds, the GaAs layer 13 and Al$_x$Ga$_{1-x}$As layer 14 grow forming (111)B faces on the sides. As a result, area of the upper layer is smaller, and in the growth of the semiinsulating Al$_x$Ga$_{1-x}$As layer 14 of the top layer, the growth is automatically stopped when the vertex is formed. In this manner, a mesa structure having a triangular cross-sectional shape is formed.

Next, as shown in FIG. 10C, for instance, a Si doped n-type Al$_x$Ga$_{1-x}$As layer 15 is grown by MOCVD at reduced pressure or at atmospheric pressure. As source materials for MOCVD, triethyl compounds are also used. Practically speaking, triethyl gallium ((C$_2$H$_5$)$_3$Ga, TEG) and triethyl aluminum ((C$_2$H$_5$)$_3$Al, TEA) are used as souce materials for Ga and Al, respectively. In this case, the n-type Al$_x$Ga$_{1-x}$As layer 15 is not grown on the insulating film 12 but is grown only on the (111)B faces of the GaAs layer 13 and Al$_x$Ga$_{1-x}$As layer 14. In this manner, quantum well fine lines comprising the GaAs layer 13 surrounded by the Al$_x$Ga$_{1-x}$As layer 14 and n-type Al$_x$Ga$_{1-x}$As layer 15 as barrier layers are formed.

In this case, one-dimensional electrons are formed in the GaAs layer 13 at the hetero interface between the n-type Al$_x$Ga$_{1-x}$As layer 15 and the GaAs layer 13 and a one-dimensional channel (shown by a broken line) is formed by the one-dimensional electrons.

As mentioned above, according to the fourth embodiment, a one-dimensional channel by a quantum well fine line can be easily formed with certainty. In this case, the GaAs layer 13, Al$_x$Ga$_{1-x}$As layer 14 and n-type Al$_x$Ga$_{1-x}$As layer 15 can be continuously grown in the same MOCVD apparatus, so that the surface of the GaAs layer 13 of the portion where one-dimensional electrons are formed is not subjected to the atmosphere. Therefore, the characteristics of the one-dimensional channel are good.

Figure 11:
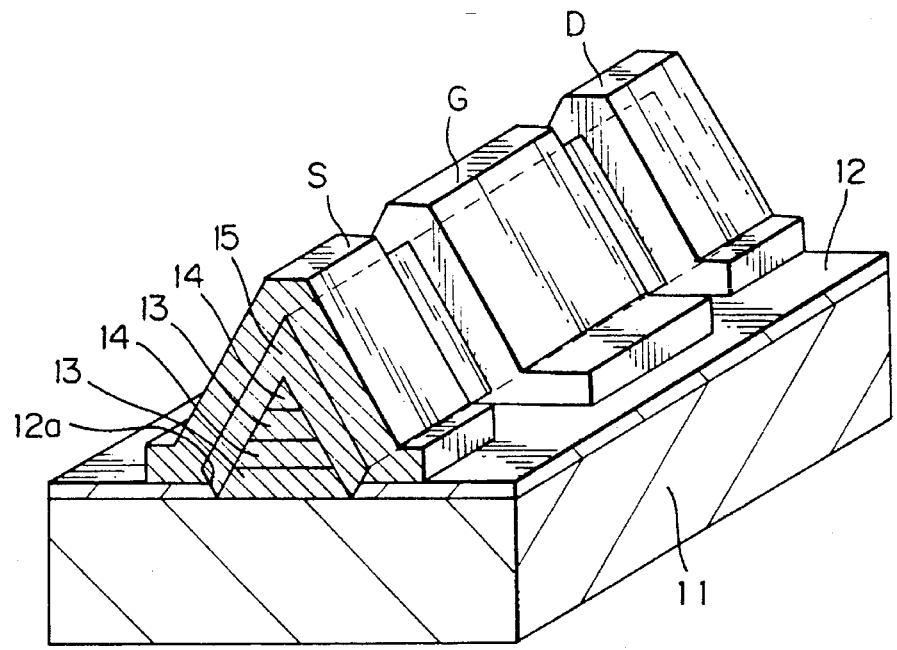
FIG. 11 is a perspective view for explaining the fifth embodiment of the present invention.

FIG. 11 shows the fifth embodiment of the present invention. The fifth embodiment relates to an embodiment in the case where the invention is applied to the manufacturing of an FET having a one-dimensional channel structure.

In the fifth embodiment, as shown in FIG. 11, after the stripe-shaped opening 12a of a predetermined length is formed on the insulating film 12, the GaAs layer 13, Al$_x$Ga$_{1-x}$As layer 14 and n-type Al$_x$Ga$_{1-x}$As layer 15 are selectively grown on the region 11a in the opening 12a by a method similar to that in the fourth embodiment.

Next, after an ohmic metal film such as AuGe/Ni is formed on the whole surface by, for example, a vacuum evaporation method, the ohmic metal film is patterned into a predetermined shape by etching. Next, by executing a thermal treatment, the ohmic metal film is alloyed with the n-type Al$_x$Ga$_{1-x}$As layer 15, Al$_x$Ga$_{1-x}$As layer 14 and GaAs layer 13. Due to this, a source S and a drain D comprising the ohmic metal of a predetermined shape and its alloy layer are formed.

Then, after a Schottky metal film such as Al or W is formed on the whole surface by, for instance, a vacuum evaporation method or a sputtering method, the Schottky metal film is patterned into a predetermined shape by etching, thereby forming the gate electrode G. Due to this, an FET having a one-dimensional channel structure is completed.

As mentioned above, according to the fifth embodiment, an FET having a one-dimensional channel structure of good characteristics can be easily manufactured. As already mentioned, since a mobility μ of electrons which run in the one-dimensional channel is extremely high, the FET of the one-dimensional channel structure can operate at a super-high frequency.

FIGS. 12A to 12D show the sixth embodiment of the present invention. The sixth embodiment relates to an embodiment in the case where the invention is applied to the manufacturing of an AB effect transistor having one-dimensional channel structure.

Figure 12A:
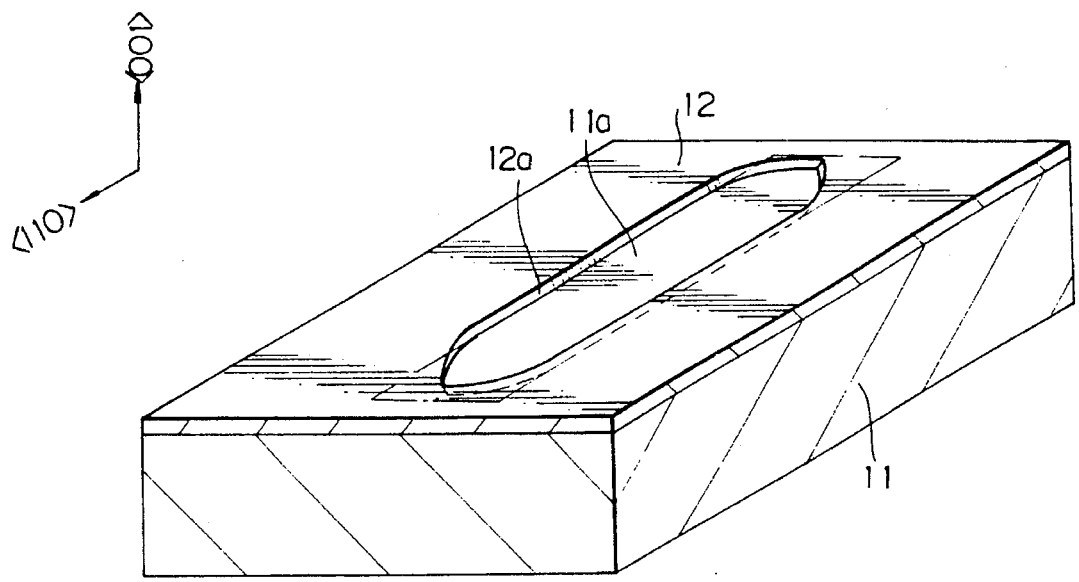
FIGS. 12A to 12D are perspective views for explaining the sixth embodiment of the present invention in accordance with the order of steps.

In the sixth embodiment, as shown in FIG. 12A, the ship-shaped opening 12a is formed on the insulating film 12.

Figure 12B:
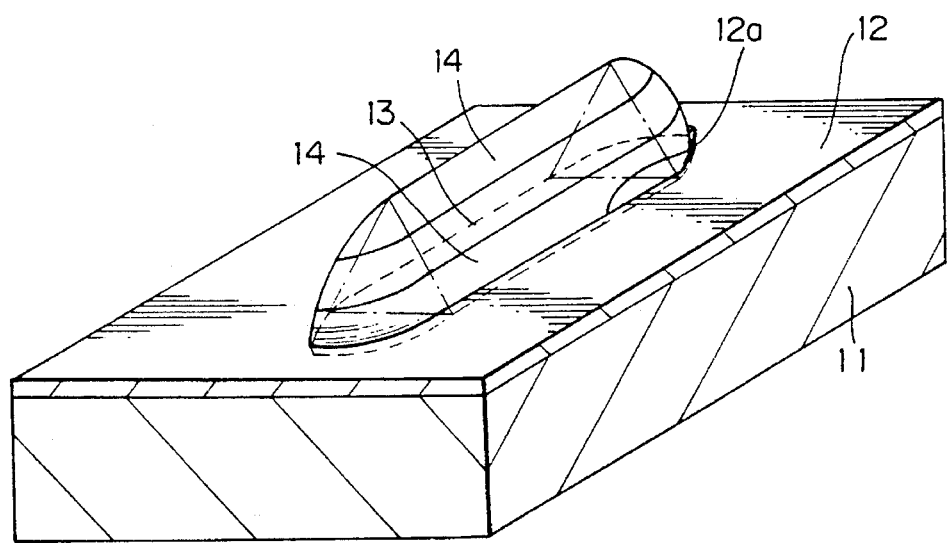

Next, as shown in FIG. 12B, the Al$_x$Ga$_{1-x}$As layer 14 and GaAs layer 13 are alternately grown on the region 11a in the opening 12a by a method similar to that in the fourth embodiment.

Figure 12C:
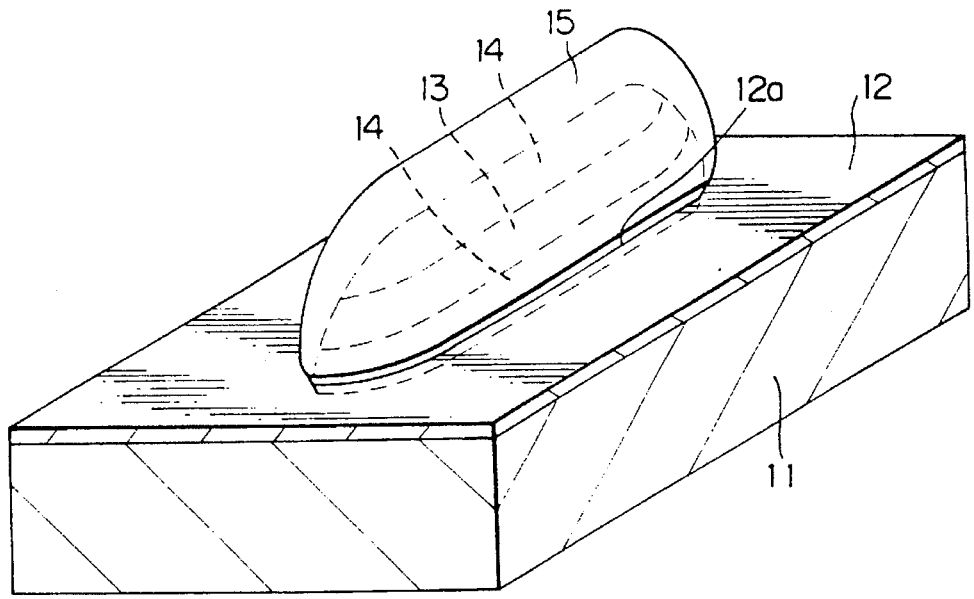

Next, as shown in FIG. 12C, the n-type $Al_xGa_{1-x}As$ layer 15 is grown so as to cover the GaAs layer 13 and $Al_xGa_{1-x}As$ layers 14.

Figure 12D:
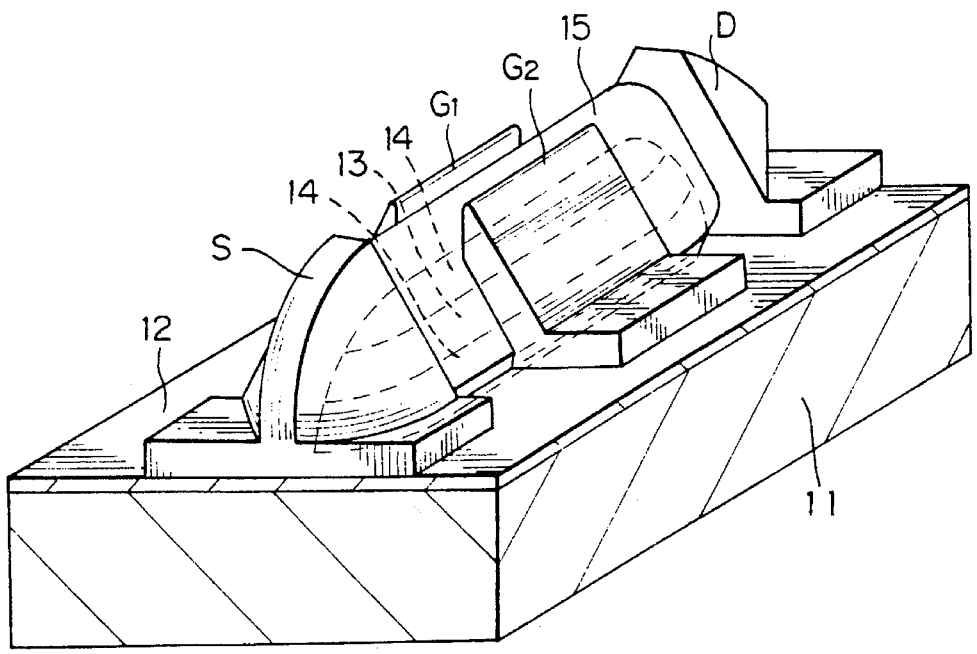

Next, as shown in FIG. 12D, the source S and drain D are formed and gate electrodes $G_1$ and $C_2$ are formed on the n-type $Al_xGa_{1-x}As$ layer 15 by a method similar to that in the fourth embodiment. It is preferable that the dimensions of the connecting portions of the source S and drain D and the one-dimensional channels which are formed on both side surfaces of the GaAs layer 13 are set to be almost equal to or smaller than the de Broglie wavelength $\lambda_e$ of electrons.

Figure 13:
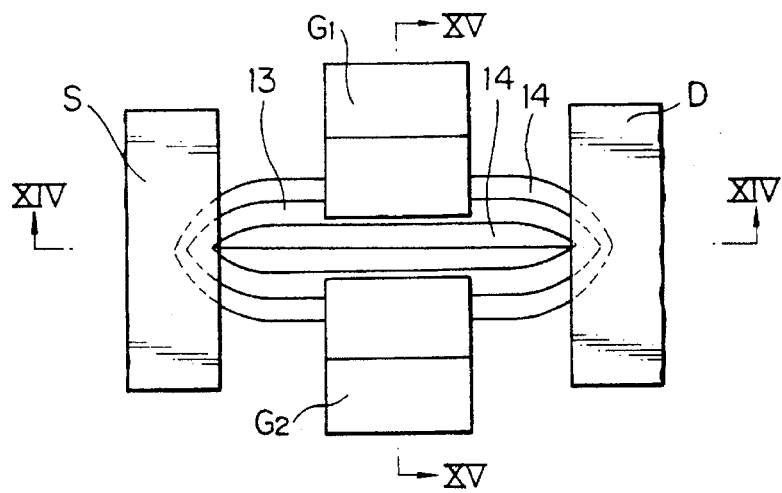
FIG. 13 is a plan view of FIG. 12D.
Figure 14:
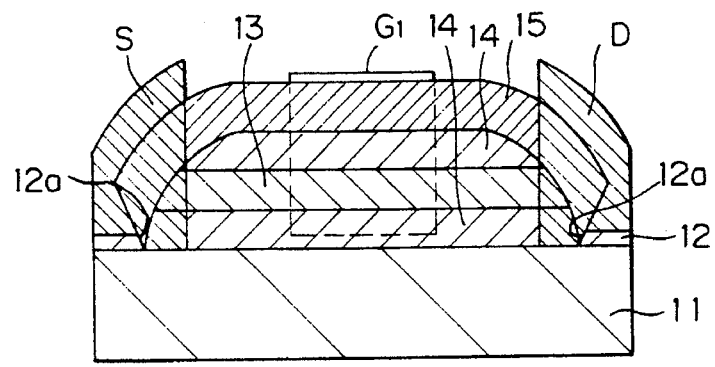
FIG. 14 is a cross-sectional view taken along the lineX IV—X IV in FIG. 13.
Figure 15:
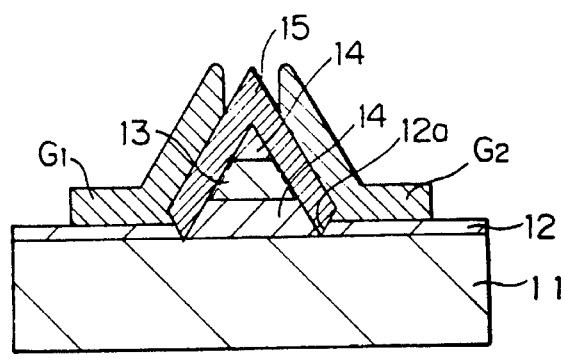
FIG. 15 is a cross sectional view taken along the lineX V—X V in FIG. 13.

As mentioned above, an objective AB effect transistor is completed. A plan view of the AB effect transistor is shown in FIG. 13. In FIG. 13, the n-type $Al_xGa_{1-x}As$ layer 15 is not shown. On the other hand, cross sectional views taken along the lines X IV—X IV and X V —X V in FIG. 13 are shown in FIGS. 14 and 15, respectively.

In the AB effect transistor constructed as mentioned above, the electron wave which is emitted from the source S bifurcates into two electron waves which pass through two one-dimensional channels which are formed on both side surfaces of the GaAs layer 13. After that, the electron waves are again joined at the drain D. Upon joining, interference of the electron waves occurs. In this case, the phase difference between the two electron waves is controlled by the gate voltage which is applied to the gate electrodes $G_1$ and $G_2$, thereby allowing the transistor action to be executed.

According to the sixth embodiment, an AB effect transistor in which the interference performance of the electron waves is high and the characteristics are good can be realized.

Figure 16:
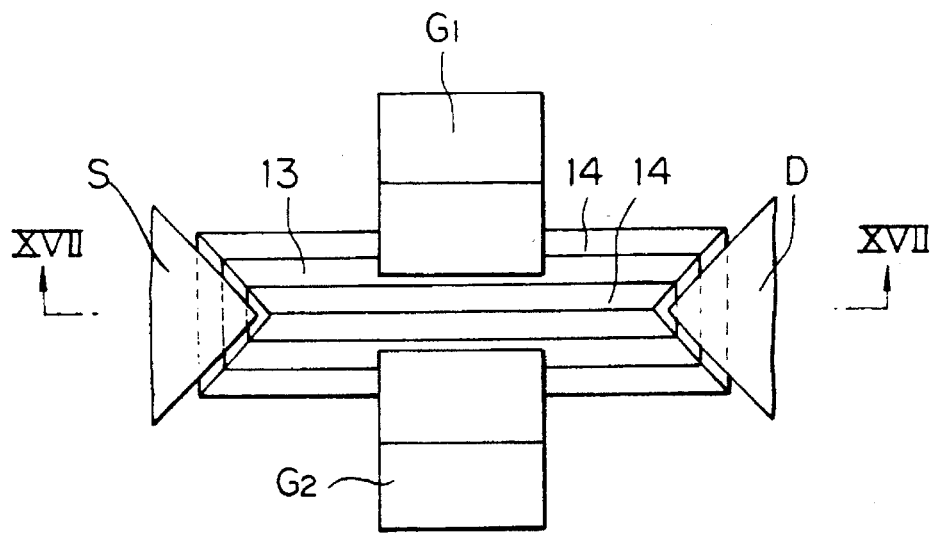
FIG. 16 is a plan view for explaining a modification of the sixth embodiment of the present invention.
Figure 17:
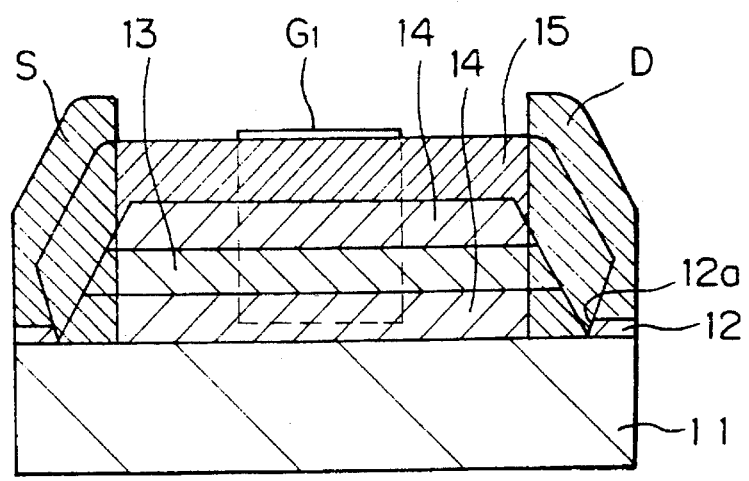
FIG. 17 is a cross sectional view taken along the lineX IV—X IV in FIG. 16.

In the above sixth embodiment, the opening 12a of the insulating film 12 has been formed in a ship-like shape. However, if the shape of the opening 12a is set to be, for instance, a rectangle as shown by an alternate long and short dash line in FIG. 12A, an AB effect transistor of a structure as shown in FIGS. 16 and 17 can be realized. In this case, in order to set the dimensions of the connecting portions of the source S and drain D and the one-dimensional channels which are formed on both side surfaces of the GaAs layer 13 to be almost equal to or smaller than the de Broglie wavelength $\lambda_e$ of the electrons, it is preferable to form the source S and drain D such that the corner portions of the source S and drain D are connected to the one-dimensional channels.

Figure 18A:
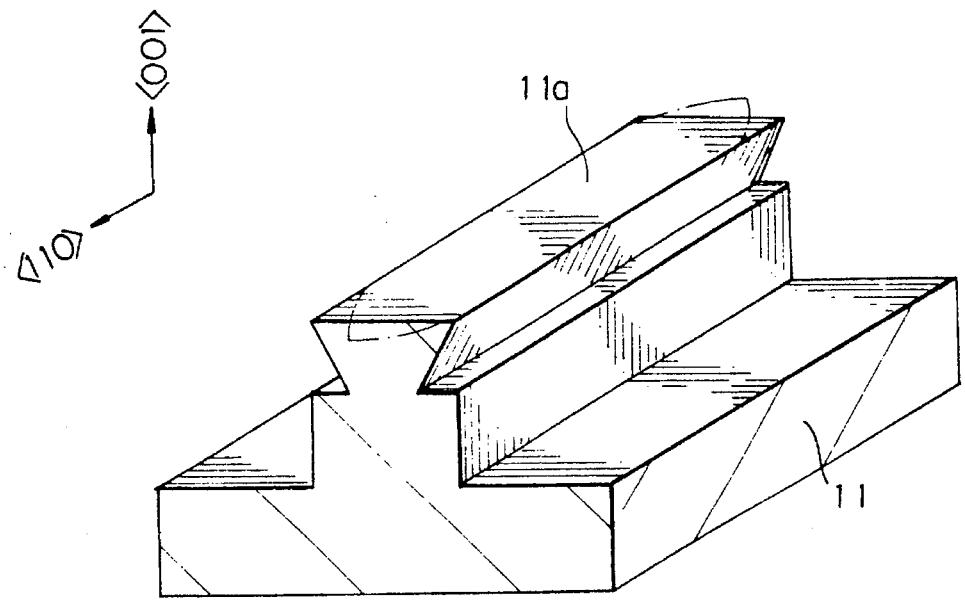
FIGS. 18A and 18B are perspective views for explaining a modification of the fourth embodiment of the present invention in accordance with the order of steps.
Figure 18B:
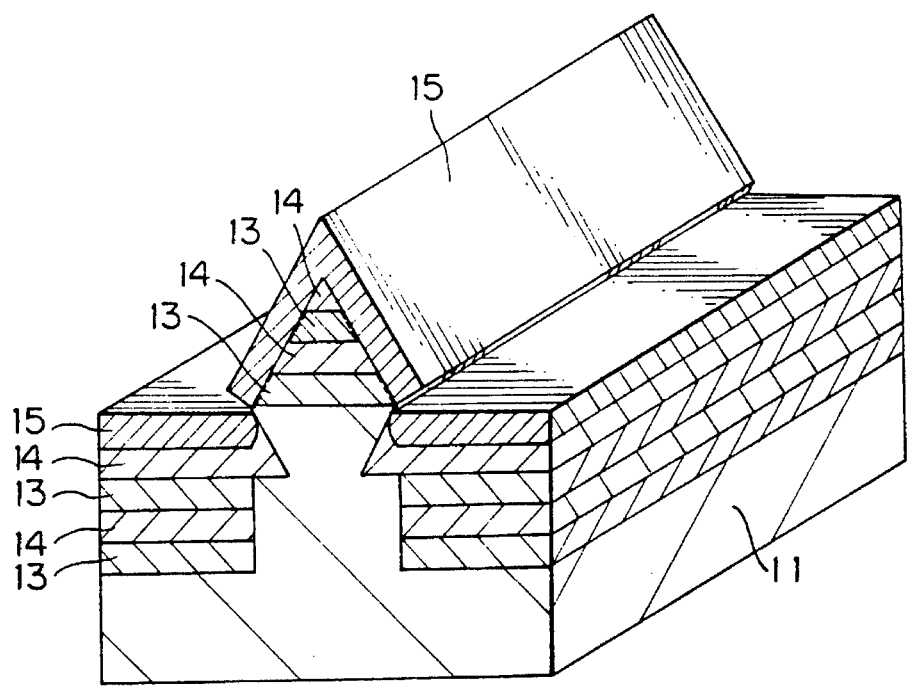

On the other hand, in the above fourth embodiment, although the GaAs layer 13 and $Al_xGa_{1-x}As$ layers 14 have selectively been grown on the region 11a in the opening 12a of the insulating film 12, for instance, the following process can be also used. That is, as shown in FIG. 18A, the surface of the semiinsulating GaAs substrate 11 is selectively removed by etching and the region 11a having a shape similar to that shown in FIG. 10A is formed. In the etching, for example, after a resist pattern (not shown) is formed on the semiinsulating GaAs substrate 11, and the semiinsulating GaAs substrate 11 is wet etched to a predetermined depth by using the resist pattern as a mask. Then the semiinsulating GaAs substrate 11 is anisotropically etched in the direction perpendicular to the substrate surface until a predetermined depth by, for instance, RIE method. Thereafter, as shown in FIG. 18B, the GaAs layer 13 and $Al_xGa_{1-x}As$ layer 14 are selectively grown on the region 11a and, further, the n-type $Al_xGa_{1-x}As$ layer 15 is grown on the layers 13 and 14, thereby completing a one-dimensional channel structure. The FET in the fifth embodiment and the AB effect transistor in the sixth embodiment can be also manufactured by a method similar to that mentioned above. In the case of the sixth embodiment, it is sufficient that the ship-shaped opening 12a as shown by an alternate long and short dash line in FIG. 18A is formed on the insulating film 12.

Further, although the AB effect transistor of the sixth embodiment has a single quantum well structure, the invention can be applied to an AB effect transistor having a multi quantum well structure and other quantum interference devices.

On the other hand, in the above fourth, fifth and sixth embodiments, although the $Al_xGa_{1-x}As$ hetero-structure has been used, the invention can be also applied to various semiconductor devices using semiconductor hetero-structures other than the $Al_xGa_{1-x}As/GaAs$ hetero-structure.

Figure 19:
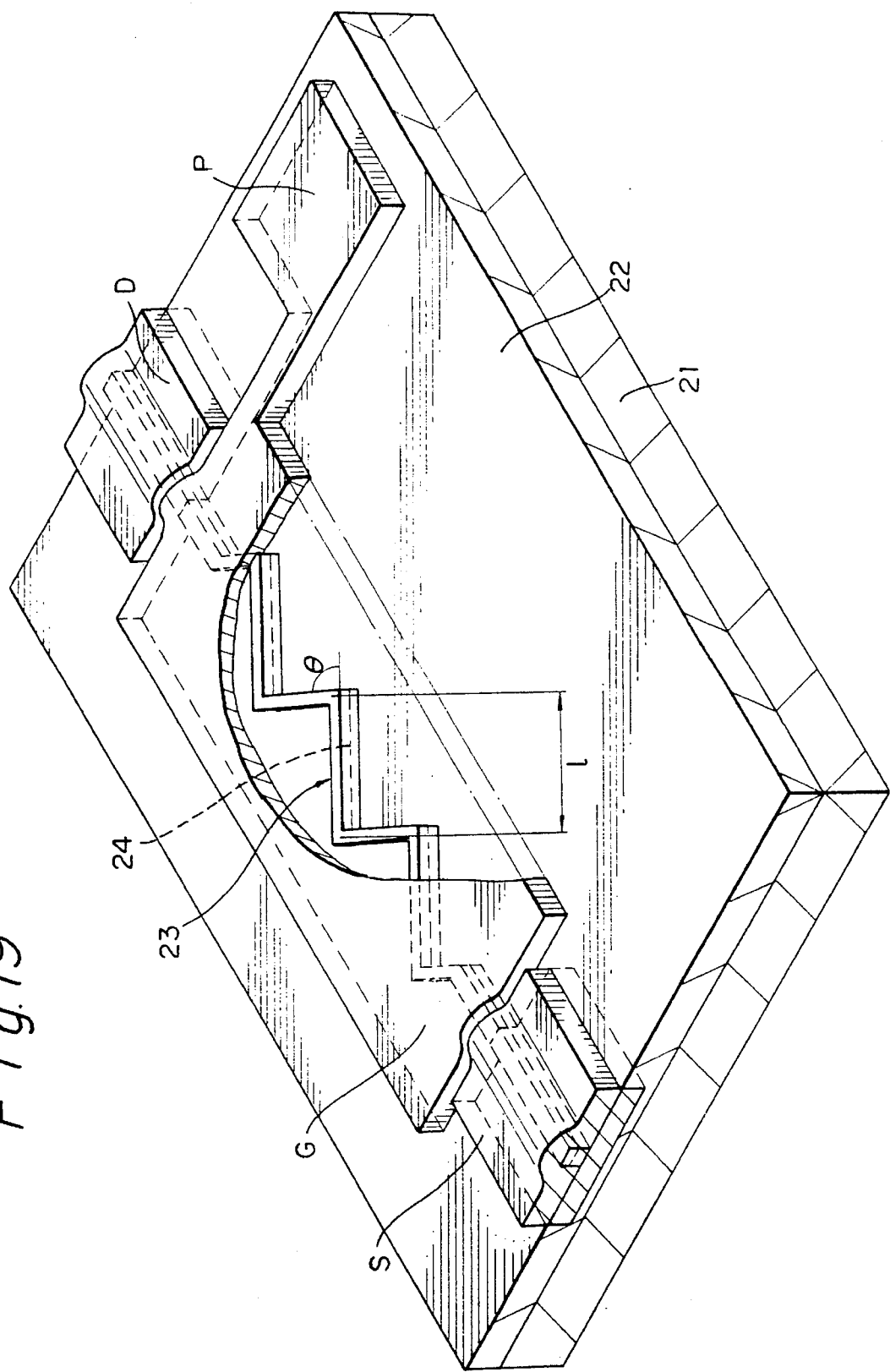
FIG. 19 is a perspective view showing an FET of the one-dimensional channel according to the seventh embodiment of the present invention.

FIG. 19 shows the seventh embodiment of the present invention. The seventh embodiment relates to an embodiment in the case where the invention is applied to an FET of the one-dimensional channel.

As shown in FIG. 19, in a one-dimensional channel FET according to the seventh embodiment, an undoped GaAs layer 22 is formed on, for instance, a semiinsulating GaAs substrate 21. An ultrafine line 23 having a width which is equal to or smaller than, for instance, about 200 Å is formed on the undoped GaAs layer 22. The ultrafine line 23 constructs a channel portion. A δ-doped layer 24 is formed on the midway in the depth direction of the ultrafine line 23. A 2DEG is formed at the position of the δ-doped layer 24. The concentration of the 2DEG can be set to an extremely high value to be about $10^{13}/cm^2$ as sheet concentration (about $10^{19}/cm^3$ as volume concentration). The 2DEG constructs a channel. Since the width of the channel comprising the 2DEG is the same as that of the ultrafine line 23, that is, for instance, about 200 Å, a one-dimensional channel is constructed by the 2DEG.

A source S and a drain D are formed on both ends of the ultrafine line 23, respectively. Further, a gate electrode G is formed between the source S and the drain D so as to cover the ultrafine line 23. Here, P indicates a pad electrode of the gate electrode G.

In the seventh embodiment, the ultrafine line 23 between the source S and the drain D has a structure such that, for instance, it is regularly bent to the right and left at a predetermined period when it is seen as a plan view. An angle θ of bending is preferably set to be, for instance, about 90° or more. On the other hand, an interval length l of each rectilinear portion of the bent ultrafine line 23 is selected to, for instance, about 1000 Å or less.

An example of a method of manufacturing the one-dimensional channel FET according to the seventh embodiment constructed as mentioned above will now be described.

Figure 20:
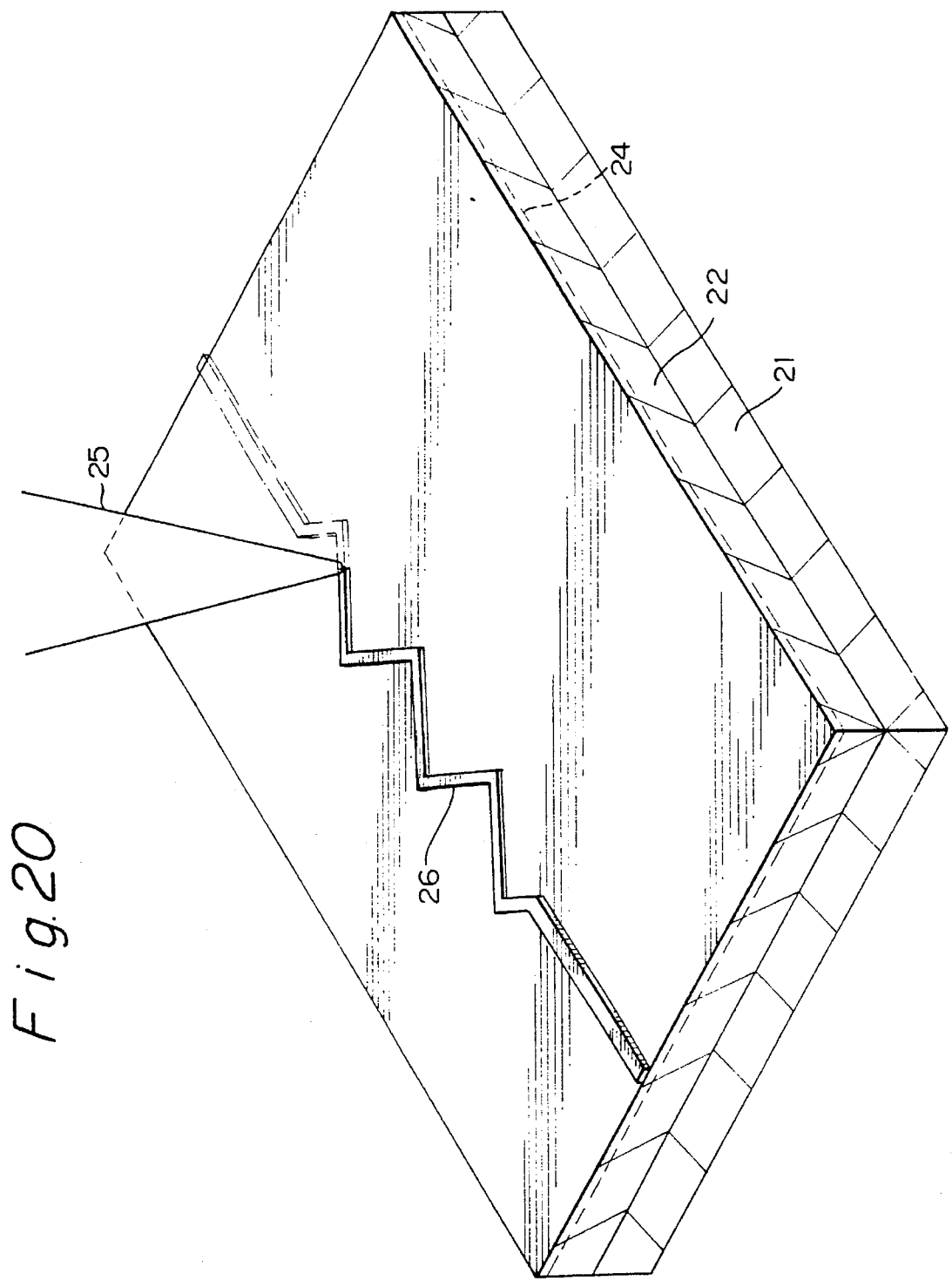
FIG. 20 is a perspective view for explaining the manufacturing method of the one-dimensional channel FET shown in FIG. 19.

As shown in FIG. 20, the undoped GaAs layer 22 of a predetermined thickness is first epitaxially grown on the semiinsulating GaAs substrate 21 by, for instance, MBE method or MOCVD method. Thereafter, the δ-doped layer 24 comprising donor impurities for GaAs such as Si is formed on the whole surface of the undoped GaAs layer 22 by, for example, the MBE method. Then, the undoped GaAs layer having a certain thickness is grown on the δ-doped layer 24.

Next, the semiinsulating GaAs substrate 21 on which the undoped GaAs layer 22 and δ-doped layer 24 are formed as mentioned above is arranged in a specimen chamber which was evacuated to a high vacuum (for instance, about $3 \times 10^{-7}$ Torr) in an electron beam irradiating apparatus having a construction similar to that of, for instance, the scanning electron microscope (SEM). Then a gaseous resist-source-material (for example, alkyl naphthalene) is led into the specimen chamber. The pressure of the source-material gas is set to a value within a range from $10^{-7}$ to $10^{-5}$ Torr, typically, set at about $10^{-6}$ Torr. After the pressure of the resist-source-material gas in the specimen chamber is stabilized to a predetrmined value, an electron beam 25 is generated from, for instance, a field emission electron gun which can generate an electron beam of good coherence. The electron beam 25 is scanned on the undoped GaAs layer 22 by a pattern corresponding to the shape of the ultrafine line 23 shown in FIG. 19. In this case, a beam diameter of the electron beam 25 is finely converted to a value of tens of Å.

In the above resist-source-material gas atmosphere, the gas molecules have been adsorbed on the surface of the undoped GaAs layer 22. When the electron beam 25 is irradiated to the adsorbed resist-source-material molecules as mentioned above, the resist-source-material molecules in the portion where the electron beam 25 is irradiated are transformed to hydrocarbon. Thus, the material comprising amorphous hydrocarbon is produced on the undoped GaAs layer 22 with the almost same resolution as that of the electron beam 25. Due to this, the resist pattern 26 comprising amorphous hydrocarbon is formed. The resist which is formed as mentioned above is called an electron beam induced resist (EBIR). It has been confirmed by the inventors of the present invention that the resist pattern 26 comprising amorphous hydrocarbon has an exellent withstanding property against dry etching. Since a thickness of the resist pattern 26 formed by a single writing operation by the electron beam 25 is ordinarily small, the step of forming hydrocarbon by irradiating the electron beam 25 to the resist-source-material molecules which are adsorbed onto the resist pattern 26 which has once been formed is repeated as necessary, thereby obtaining the resist pattern 26 having a predetermined thickness.

Next, the undoped GaAs layer 22 is anisotropically etched by using the resist pattern 26 as a mask until a predetermined thickness which is deeper than at least the δ-doped layer 24, for instance, by RIE method. After that, the resist pattern 26 is removed. Thus, as shown in FIG. 19, the ultrafine line 23 which is defined by the resist pattern 26 and whose width is, for instance, about 200 Å is formed. Next, an ohmic metal film is formed onto the whole surface by, for instance, a vacuum evaporation method. The ohmic metal film is patterned into a predetermined shape by lift-off and only the portions near both ends of the ultrafine line 23 are left. Thereafter, by executing a thermal treatment, the ohmic metal film and undoped GaAs layer 22 are alloyed, thereby forming the source S and drain D. After a Schottky metal film to form a gate electrode is formed onto the whole surface, the Schottky metal film is patterned into a predetrmined shape by etching, thereby forming the gate electrode G and its pad electrode P. Due to this, an objective one-dimensional channel FET is completed as shown in FIG. 19.

As mentioned above, according to the seventh embodiment, since the one-dimensional channel portion is formed by the ultrafine line 23 which is periodically bent every length of about 1000 Å or less, wavelengths of phonons which are generated in the ultrafine ling 23 are limited to less than about 1000 Å. Thus, the phase space of electron-phonon scattering in the ultrafine line 23 decreases because of the wavelength limitation, and the probability of scatterings of the electrons by the phonons is suppressed. Particularly, since the phonons of a long wavelength are effective to scatter the electrons, the scattering of the electrons is extremely reduced by the above wavelength limitation of the phonons to about 1000 Å. Due to this, a one-dimensional channel FET of high speed, low electric power consumption, and high performance can be realized. On the other hand, since the influence by the phonons can be suppressed, the one-dimensional channel FET can operate at a higher temperature.

Figure 21:
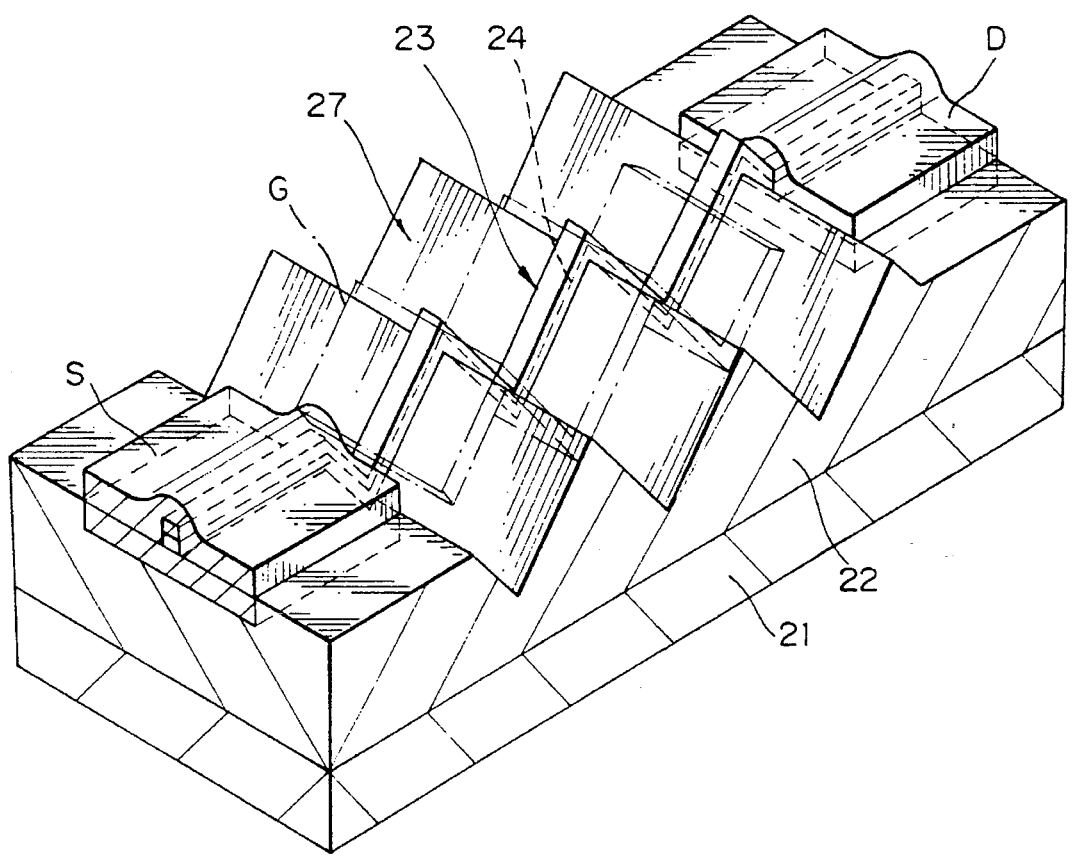
FIG. 21 is a perspective view showing a one-dimensional channel FET according to the eighth embodiment of the present invention.

FIG. 21 shows the eighth embodiment of the present invention. The eighth embodiment relates to an embodiment in the case where the present invention is applied to a one-dimensional channel FET similarly to the seventh embodiment.

As shown in FIG. 21, in the one-dimensional channel FET according to the eighth embodiment, a grating 27 comprising a stripe-shaped convex portions having triangular cross-section is formed on the surface of the undoped GaAs layer 22. The length of the side of the triangle is set to about 1000 Å or less and the pitch of the convex portion is set to about 2000 Å or less, The ultrafine line 23 constructing the one-dimensional channel portion is formed on the grating 27 so as to run across the convex portions. Thus, although the ultrafine line 23 in the seventh embodiment is bent in the plane which is parallel with the surface of the semiinsulating GaAs substrate 21, the ultrafine line 23 in the eighth embodiment is bent in the plane perpendicular to the surface of the semiinsulating GaAs substrate 21. The length z of interval of each rectilinear portion of the bent ultrafine line 23, a bending angle θ, and the like can be set to values similar to those in the seventh embodiment.

An example of a method of manufacturing a one-dimensional channel FET according to the eighth embodiment constructed as mentioned above will now be described.

Figure 22:
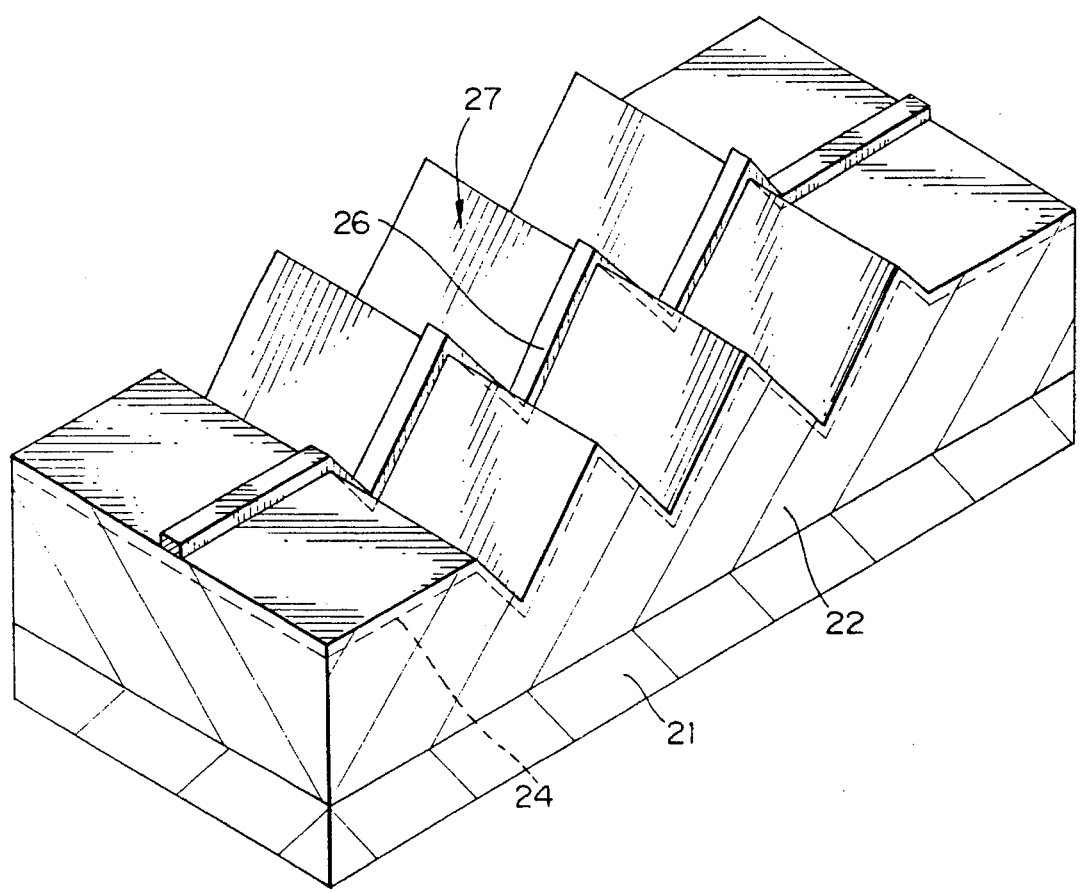
FIG. 22 is a perspective view for explaining the method of manufacturing the one-dimensional channel FET shown in FIG. 21.

As shown in FIG. 22, after the undoped GaAs layer 22 is first epitaxially grown on the semiinsulating GaAs substrate 21 by MBE or by MOCVD, the grating 27 is formed on the surface of the undoped GaAs layer 22 by, for instance, the following method. After a photo resist (not shown) is first coated onto the undoped GaAs layer 22, the photo resist is exposed in a stripe shape at the same pitch as that of the grating 27 to be formed, by a holographic exposing method as a light exposing method using a laser beam. Thereafter, the photo resist is developed and a stripe-shaped resist pattern is formed. The resist pattern being used as a mask, the undoped GaAs layer 22 is wet-etched, for instance, by an etching solution which can afford strong anisotropy. Due to this, as shown in FIG. 22, the grating 27 is formed on the surface of the undoped GaAs layer 22. After the δ-doped layer 24 is formed on the grating 27, for instance, by the MBE method, undoped GaAs is grown on the δ-doped layer 24, thereby forming the undoped GaAs layer 22 having a predetermined thickness.

Next, the resist pattern 26 of an ultrafine width comprising an EBIR is formed on the surface of the grating 27 by a method similar to that in the seventh embodiment. In this case, since it is necessary to form the resist pattern 26 onto the grating 27 in which amplitudes of concave and convex portions on the surface are large, it is preferable to form the resist pattern 26 by using an electron beam irradiating apparatus having a construction similar to that of the out-of-lens type SEM whose focal depth (1 to 10 μm) is by about one order of magnitude larger than that of an optical exposing-apparatus, although it depends on the accelerating voltage. By using such an electron beam irradiating apparatus, the resist pattern 26 of an ultrafine width can be easily formed on the surface of the grating 27 having concave and convex portions so as to cross the convex portions. Next, the resist pattern 26 is used as a mask and the undoped GaAs layer 22 is anisotropically etched until only a predetermined depth by, for instance, the RIE method. Due to this, the ultrafine line 23 is formed on the grating 27 as shown in FIG. 21. Thereafter, in a manner similar to the seventh embodiment, the source S and drain D are respectively formed at both ends of the ultrafine line 23 and the gate electrode G is formed between the source S and the drain D. Thus, an objective one-dimensional channel FET is completed as shown in FIG. 21.

According to the eighth embodiment, since the ultrafine line 23 constructing the one-dimensional channel portion has a structure such that it is bent every length of about 1000 Å similarly to the seventh embodiment, the scattering of the electrons by the phonons in the ultrafine line 23 can be effectively suppressed by the same reasons as those described in the seventh embodiment. Thus, a one-dimensional channel FET of high performance in which influence of the phonons is suppressed can be realized.

Figure 23:
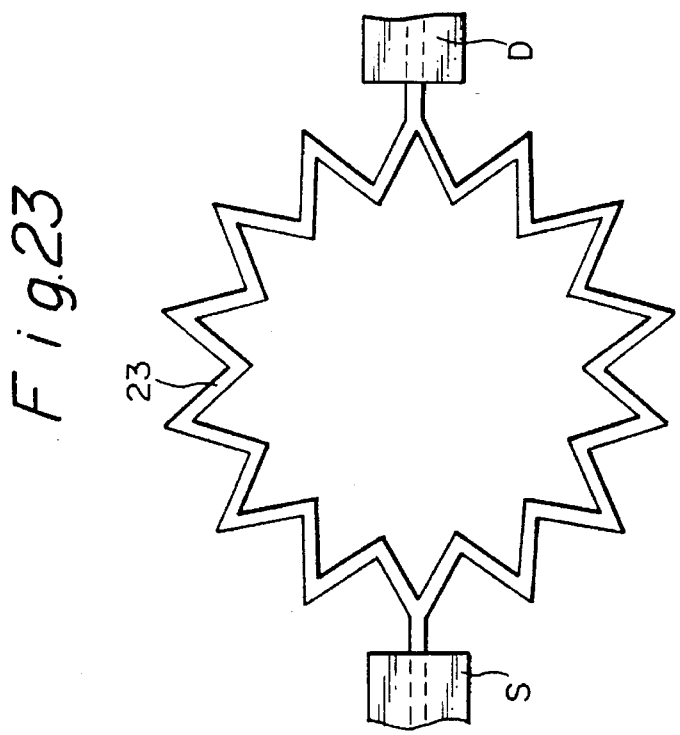
FIG. 23 is a plan view showing an AB effect transistor according to the ninth embodiment of the present invention.

FIG. 23 shows the ninth embodiment of the present invention. The ninth embodiment relates to an embodiment in the case where the invention is applied to an AB effect transistor having a construction as shown in FIG. 1.

Figure 1:
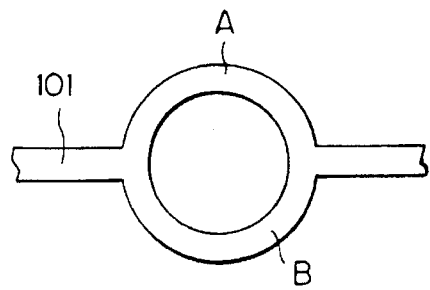
FIGS. 1, 2 and 3 are plan views showing a channel portion of conventional AB effect transistors.

As shown in FIG. 23, according to the ninth embodiment, in the AB effect transistor of the planar type having a construction similar to that shown in FIG. 1, a one-dimensional multichannel is formed by the ultrafine line 23 which is periodically bent such that an interval length of each rectilinear portion is set to about 1000 Å or less and has a ring-like topology.

A method of manufacturing the AB effect transistor according to the ninth embodiment is similar to the manufacturing method of the one-dimensional channel FET in the seventh embodiment except that a resist pattern (not shown) comprising the EBIR to define the ultrafine line 23 shown in FIG. 23 is used as a mask and the undoped GaAs layer 22 is etched to form thereby the ultrafine line 23.

According to the ninth embodiment, since the multichannel is formed by the ultrafine line 23 which is periodically bent, the scattering of the electron waves by the phonons in the ultrafine line 23 can be suppressed in a manner similar to the seventh and eighth embodiments, so that it becomes difficult for the pnonons to exert influence at high temperature as well as at low temperature. Therefore, a coherent distance of the electron waves in the multichannel comprising the ultrafine line 23 is so long even at a high temperature that coherence is held until a high temperature. Thus, the AB effect transistor can operate at a higher temperature.

Figure 24:
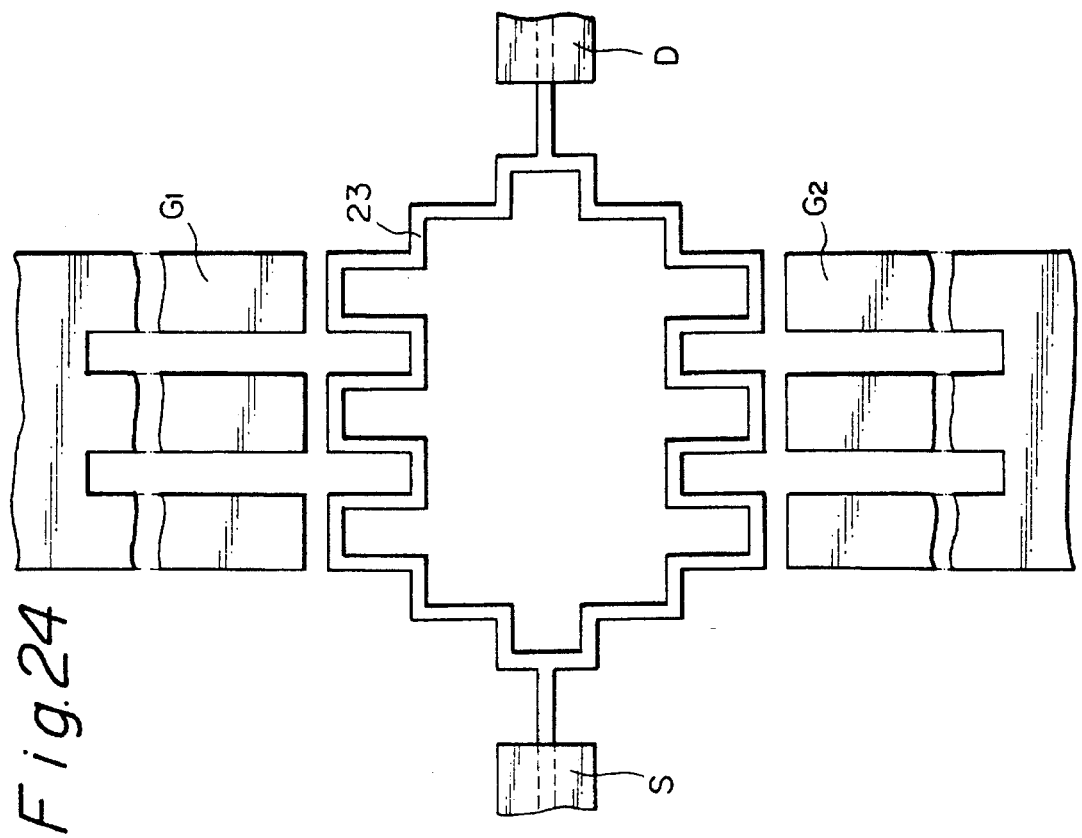
FIG. 24 is a plan view showing an AB effect transistor according to the tenth embodiment of the present invention.

FIG. 24 shows the tenth embodiment of the present invention. The tenth embodiment relates to case where invention is applied to an AB effect transistor having a construction as shown in FIG. 2.

Figure 2:
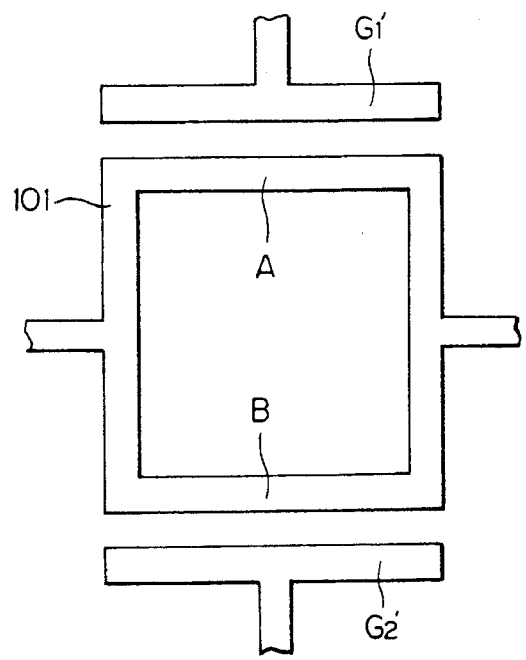

As shown in FIG. 24, according to the tenth embodiment, in the AB effect transistor of the planar type having a construction similar to that shown in FIG. 2, a multichannel is formed by the ultrafine line 23 which is periodically bent in such a manner that an interval length of each rectilinear portion is set to about 1000 Å or less and has a rectangular shape as a whole. A pair of gate electrodes $G_1$ and $G_2$ are formed on the outside of the ultrafine line 23 forming the multichannel so as to be adjacent to the ultrafine line 23. In this case, the gate electrodes $G_1$ and $G_2$ have a comb-like shape. A voltage is applied between the gate electrodes $G_1$ and $G_2$. In general, one of the gate electrodes $G_1$ and $G_2$ (for instance, the gate electrode $G_2$) is set to an earth potential (=0) and a voltage V is applied to the other (for example, the gate electrode $G_1$).

Since a manufacturing method of the AB effect transistor constructed as mentioned above according to the tenth embodiment is similar to that in the ninth embodiment its description is omitted.

As mentioned above, according to the tenth embodiment, since the ultrafine line 23 constructing the multichannel is periodically bent at an interval of about 1000 Å or less, an AB effect transistor of high performance which can operate at a higher temperature can be realized similarly to the ninth embodiment.

Figure 25:
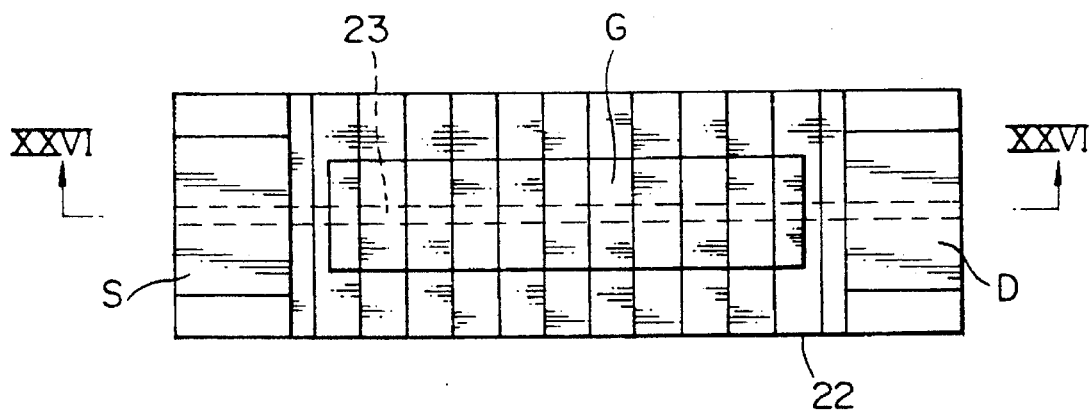
FIG. 25 is a plan view showing an AB effect transistor according to the eleventh embodiment of the present invention.
Figure 26:
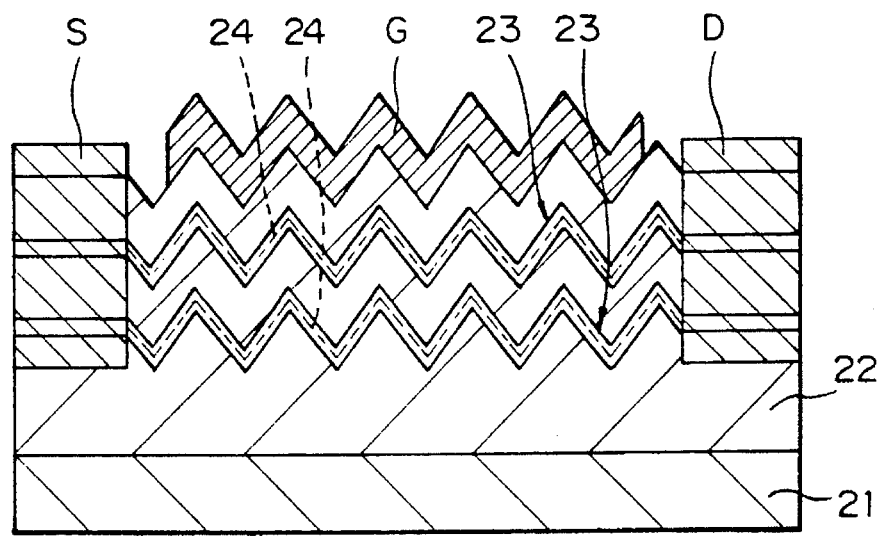
FIG. 26 is a cross sectional view taken along the lineX X X VI—X X VI in FIG. 25.

FIGS. 25 and 26 show the eleventh embodiment of the present invention. The eleventh embodiment relates to an embodiment in the case where the invention is applied to an AB effect transistor having a construction as shown in FIG. 3.

Figure 3:
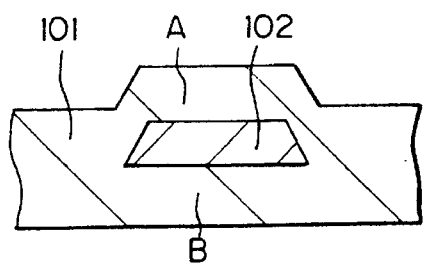
Figure 4:
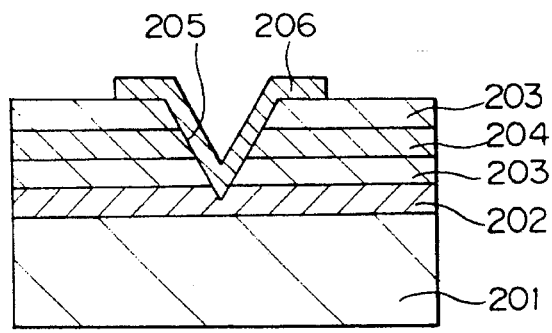
FIGS. 4, 5 and 6 are cross sectional views showing conventional one-dimensional channel structures respectively.
Figure 5:
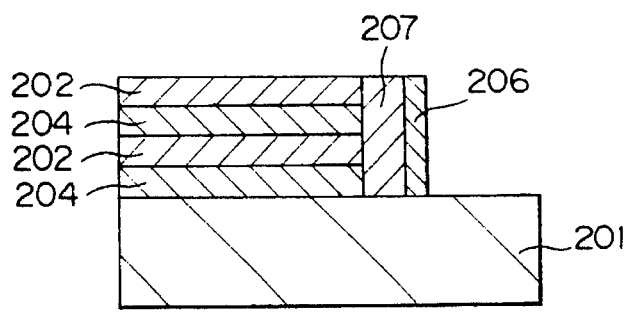
Figure 6:
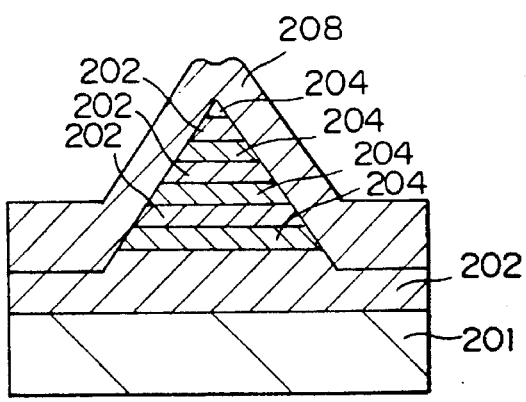

As shown in FIGS. 25 and 26, according to the eleventh embodiment, in an AB effect transistor of the vertical type having construction similar to that shown in FIG. 3, a multichannel is formed by two ultrafine lines 23 which are bent at an interval of about 1000 Å or less and are placed between the source S and the drain D.

To manufacture the AB effect transistor according to the eleventh embodiment, for instance, two δ-doped layers 24 are formed during the step of epitaxial growth of the undoped GaAs layer 22 on the semiinsulating GaAs substrate 21. Next, the undoped GaAs layer 22 is anisotropically etched in the direction perpendicular to the substrate surface by a method similar to that in the eighth embodiment, thereby patterning the undoped GaAs layer 22 so as to have an ultrafine width. Thereafter, the source S, drain D, and gate electrode G are formed, thereby completing an objective AB effect transistor.

As mentioned above, according to the eleventh embodiment, since a multichannel is formed by two ultrafine lines 23 which are periodically bent with an interval length of about 1000 Å or less, influence by the phonons in the multichannel can be suppressed. Thus, an AB effect transistor which can operate at a higher temperature can be realized.

The number of bending of the ultrafine line 23 in the above seventh to eleventh embodiments can be arbitrarily selected. The number of bending times can be also one in accordance with the case. On the other hand, the portion between the bent portions of the ultrafine line 23 is not always necessary to be rectilinear as shown in the above seventh to eleventh embodiments but can be set to an arbitrary shape. Further, in the above seventh to eleventh embodiments, the 2DEG formed in the portion of the δ-doped layer 24 has been used as a channel. However, for instance, the 2DEG formed on the GaAs side of the n-type AlGaAs/GaAs hetero interface can be also used as a channel.

In the above seventh to eleventh embodiments, although GaAs has been used as semiconductor material, various semiconductor materials other than GaAs can be obviously used. On the other hand, although the semiconductor devices in the seventh to eleventh embodiments have used electrons as carriers, the invention can be also obviously applied to a semiconductor device using holes as carriers.

Further, instead of the electron beam 25, other charged particale beam such as a positron beam and a muon beam.

As described above, according to the semiconductor device of the present invention, since the multichannel is formed by the Dirac-delta-doped layer, the interference effect of the electron waves can be raised.

On the other hand, according to the semiconductor device of the present invention, the interference effect of the electron waves can be raised and high integration density can be realized. Moreover, the semiconductor device can be operated at a higher temperature.

According to the method of manufacturing a semiconductor of the present invention, one-dimensional channel can be easily formed.

According to the method of manufacturing a semiconductor device of the present invention, a one-dimensional channel having good characteristics can be easily formed with certainty.

According to the semiconductor device of the present invention, an FET of a one-dimensional channel having good characteristics can be realized.

According to the semiconductor device of the present invention, a one-dimensional channel semiconductor device of high performance in which influence of phonons is suppressed can be realized.

According to the method of manufacturing a semiconductor device of the present invention, a semiconductor device of the one-dimensional channel of high performance in which influence of phonons is suppressed can be easily manufactured.

Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

What is claimed is:

1. A semiconductor device in which a channel portion comprising a zigzag line is provided between a source and a drain, said zigzag line having a width which is negligible in comparison to the length of said line.

2. A semiconductor device according to claim 1, wherein phonons are confined in the location of said zigzag line.

3. A semiconductor device according to claim 1, wherein a plurality of said lines are provided between said source and said drain, and by controlling the phase of electron waves which respectively pass through said plurality of lines, interference of said electron waves is caused.

* * * * *